US012660294B2

(12) United States Patent
    Liaw

(10) Patent No.:     US 12,660,294 B2
(45) Date of Patent:         Jun. 16, 2026

(54) DEVICE STRUCTURE HAVING DIELECTRIC WALLS CONNECTED TO A GATE STRUCTURE AND METHOD FOR MANUFACTURING THE SAME

(71) Applicant: TAIWAN SEMICONDUCTOR MANUFACTURING COMPANY, LTD., Hsinchu (TW)

(72) Inventor: Jhon Jhy Liaw, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 412 days.

(21) Appl. No.: 18/345,973

(22) Filed: Jun. 30, 2023

(65) Prior Publication Data

US 2025/0006828 A1     Jan. 2, 2025

(51) Int. Cl.
   H10D 84/01      (2026.01)
   H10D 30/01      (2025.01)
   H10D 30/43      (2025.01)
   H10D 30/67      (2025.01)
   H10D 84/03      (2025.01)
              (Continued)

(52) U.S. Cl.
   CPC ....... H10D 84/0151 (2025.01); H10D 30/014 (2025.01); H10D 30/031 (2025.01); H10D 30/43 (2025.01); H10D 30/6735 (2025.01); H10D 84/0128 (2025.01);
              (Continued)

(58) Field of Classification Search
   CPC .... H01L 23/528; H10D 30/01; H10D 30/014; H10D 30/017; H10D 30/019–0198; H10D 30/0273; H10D 30/031; H10D 30/0312; H10D 30/0318; H10D 30/43; H10D 30/435; H10D 30/501–509; H10D 30/6735; H10D 64/017; H10D 84/01; H10D 84/0128; H10D 84/0142; H10D 84/0151; H10D 84/0153; H10D 84/02; H10D 84/032; H10D 84/035; H10D 84/038; H10D 84/05; H10D 84/07; H10D 84/08; H10D 84/8311; H10D 84/8312; H10D 84/83125; H10D 84/83135; H10D 84/83138; H10D 84/8314; H10D 84/8316; H10D 84/832–833; H10D 84/835; H10D 84/836;
              (Continued)

(56) References Cited

U.S. PATENT DOCUMENTS 9,613,953 B2     4/2017  Liaw
9,793,273 B2    10/2017  Liaw
              (Continued)

*Primary Examiner* — Cheung Lee
(74) *Attorney, Agent, or Firm* — Birch, Stewart, Kolasch & Birch, LLP

(57)            ABSTRACT

A device structure includes a substrate, a fin structure disposed on the substrate and elongated in an X direction, a gate structure formed on the fin structure and elongated in a Y direction transverse to the X direction to terminate at two opposite ends, at least one dielectric portion connected to at least one of the two opposite ends of the gate structure, and having two sides that are opposite to each other in the X direction, and a pair of gate spacers which are spaced apart from each other in the X direction and are respectively disposed on two lateral sides of the gate structure, and which are elongated in the Y direction to cover the two sides of the dielectric portion, respectively. A method for manufacturing the device structure is also disclosed.

20 Claims, 27 Drawing Sheets

(51) Int. Cl.
    *H10D 84/83*         (2025.01)
    *H10W 20/43*         (2026.01)

(52) U.S. Cl.
    CPC ....... *H10D 84/0142* (2025.01); *H10D 84/038*
            (2025.01); *H10D 84/83* (2025.01); *H10W*
                                     *20/43* (2026.01)

(58) Field of Classification Search
    CPC ......... H10D 84/837–839; H10D 89/10; H10D
                               84/01563; H10D 84/83
    See application file for complete search history.

(56)                        References Cited

U.S. PATENT DOCUMENTS 9,805,985 B2    10/2017  Liaw
2016/0056181 A1*   2/2016  Anderson ............ H10D 84/834
                                              438/157
2019/0378914 A1*  12/2019  Huang ................ H10D 84/014

* cited by examiner

400

DEVICE STRUCTURE HAVING DIELECTRIC WALLS CONNECTED TO A GATE STRUCTURE AND METHOD FOR MANUFACTURING THE SAME

BACKGROUND

Transistors are key active components in modern integrated circuits (ICs). With rapid development of semiconductor technology, critical dimension (CD) of transistors keeps shrinking and various three-dimensional (3D) transistor structures are developed, making it possible to integrate a large number of transistors per unit area. In addition, transistors in an IC may have difference in configuration and/or size, such that the transistors can be integrated together to form different operating units (e.g., memories, inverters, logic gates, flash, etc.) with different functions. In such cases, specific characteristics of the transistors and methods for manufacturing the transistors to overcome physical limitations (e.g., a lithography patterning limitation) become critical.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
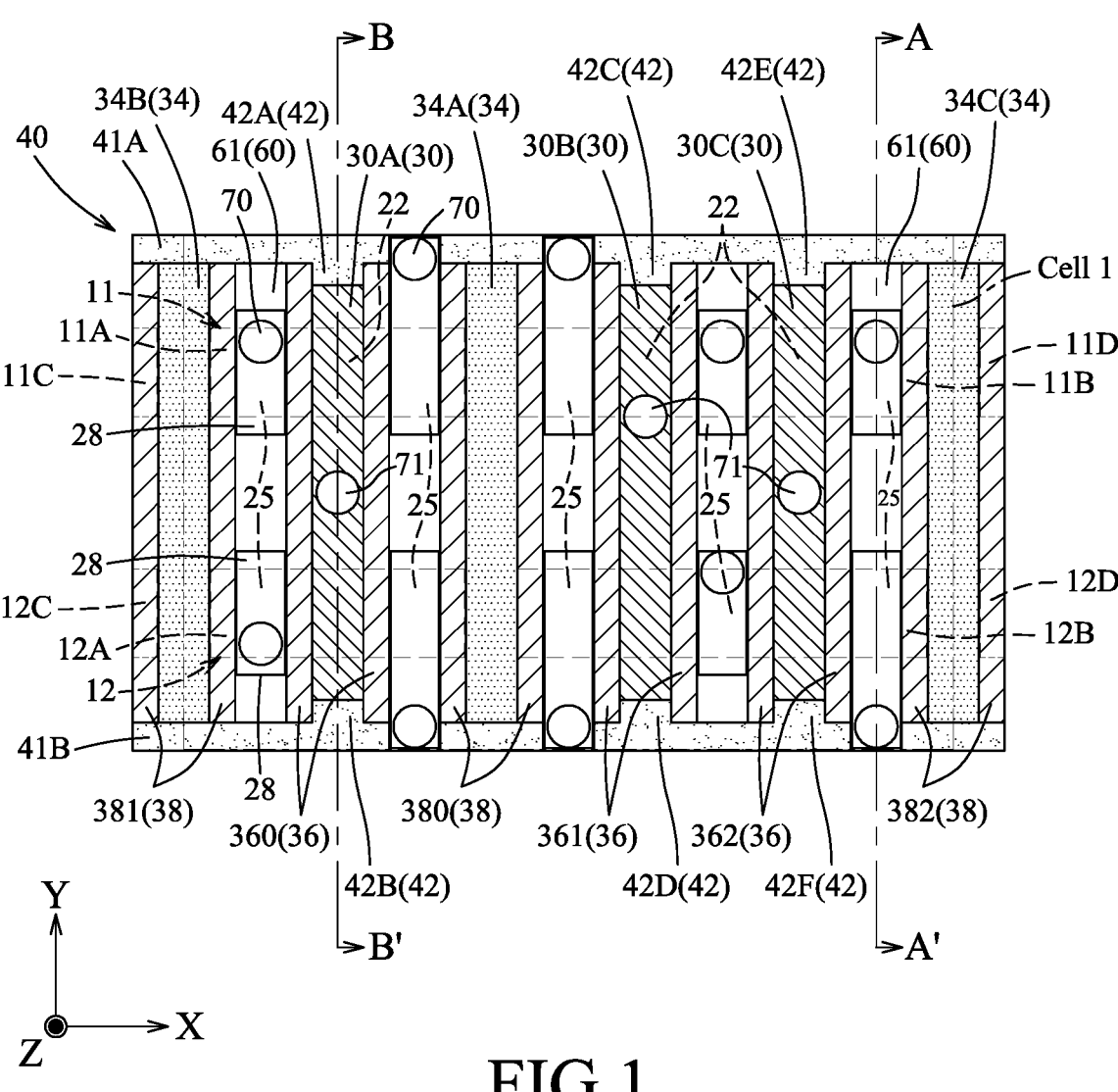
FIG. 1 is a top view of a device structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," "front," "rear," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of this specification and appended claims, unless otherwise indicated, all numbers expressing amounts, sizes, dimensions, proportions, shapes, formulations, parameters, percentages, quantities, characteristics, or other numerical values used in the specification and claims, are to be understood as being modified in all instances by the term "about" even if the term "about" is not explicitly recited with the values, amounts or ranges. Accordingly, unless indicated to the contrary, the numerical parameters set forth in the following specification and appended claims are not and need not be exact, but may be approximations and/or larger or smaller than specified as desired, may encompass tolerances, conversion factors, rounding off, measurement error, and other factors known to those of skill in the art depending on the desired properties sought to be obtained by the presently disclosed subject matter. For example, the term "about," when used with a value, can capture variations of, in some aspects ±10%, in some aspects ±5%, in some aspects ±2.5%, in some aspects ±1%, in some aspects ±0.5%, and in some aspects ±0.1% from the specified amount, as such variations are appropriate to perform the disclosed methods or employ the disclosed compositions.

At present, as critical dimensions (CD) of transistors continue to shrink and various three-dimensional (3D) transistor structures (e.g., a gate-all-around (GAA) structure, a fin field-effect transistor (FinFET) structure, etc.) are being developed for manufacturing integrated circuit (IC) with a high integration density, several characteristics of transistors become critical. For example, a parasite capacitance between two different components (e.g., a metal gate and another metal gate, a metal gate and a shallow trench isolation (STI), a metal gate and a contact feature, or other adjacent layers, etc.) is desired to be reduced. In the following, the present disclosure is directed to a device structure including one device or a plurality of devices adjacent to each other. The devices in the device structure may be independently configured as nanosheet gate-all-around field-effect transistors (GAA FETs), nanowire GAA FETs, FinFET or other suitable configurations. The devices in the device structure may constitute one or more of an N-type metal-oxide-semiconductor field-effect transistor (MOSFET), a P-type MOSFET, a complementary metal-oxide-semiconductor (CMOS), and may be integrated to function as memory cells, inverters, logic gates (e.g., NOR gates and NAND gates), or other suitable applications. The devices in the device structure each may have a gate electrode with a gate-end portion that is located on the STI and that has a relatively smaller length, which is beneficial for reducing gate-end portion-related capacitance. Shorter gate-end portion may be beneficial for reducing the capacitances induced by (i) the gate-end portions of two adjacent ones of the devices, (ii) the gate end portion and the STI, (iii) the gate end portion and the contact feature, and other adjacent layers-induced parasitic capacitance.

Figure 2:
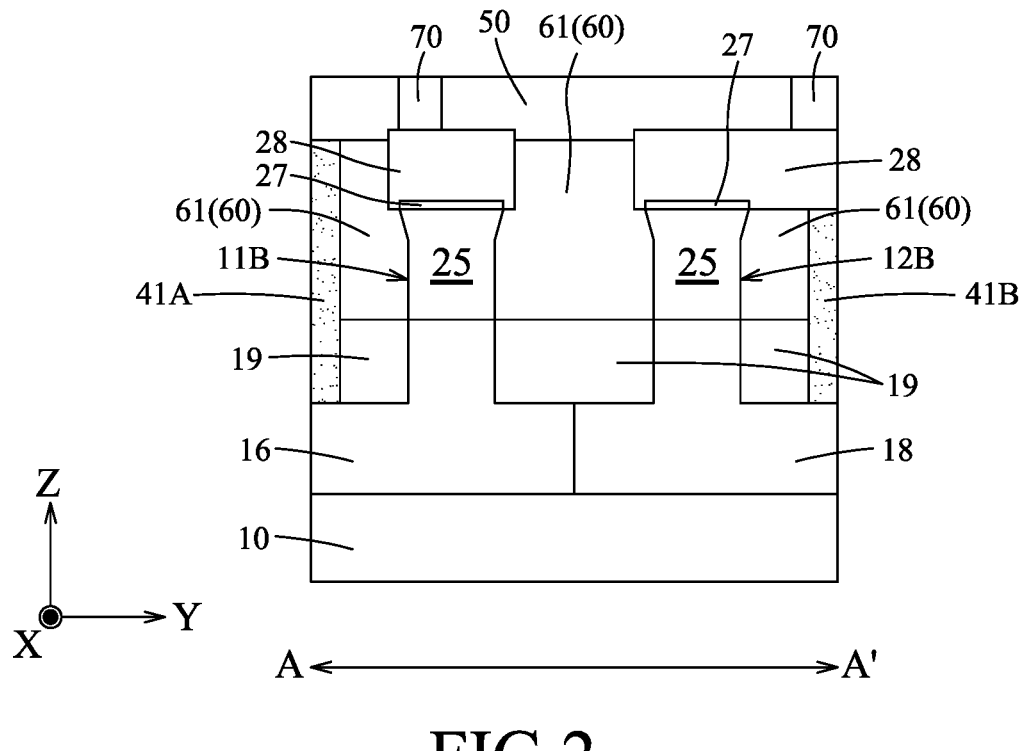
FIGS. 2 and 3 are cross-sectional views respectively taken along lines A-A' and B-B' of FIG. 1 in accordance with some embodiments.
Figure 3:
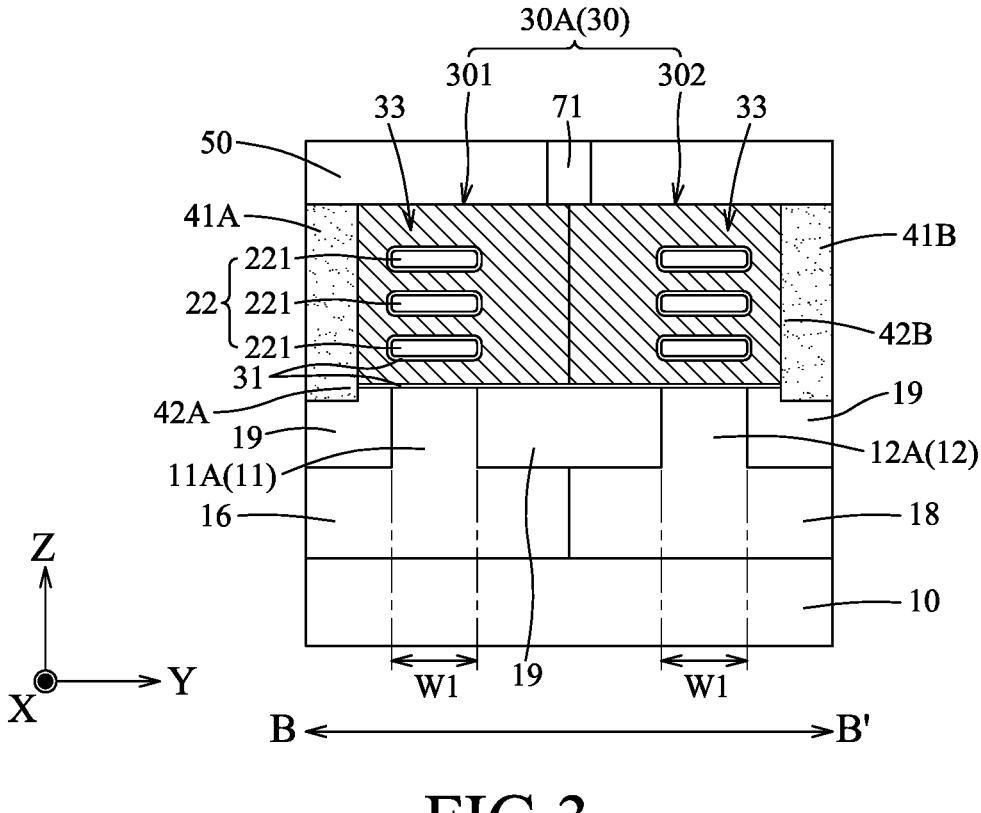

FIG. 1 is a top view of a device structure 100 in accordance with some embodiments. FIGS. 2 and 3 are cross-sectional views respectively taken along lines A-A' and B-B' of FIG. 1 in accordance with some embodiments. The device structure 100 may include one or more GAA FETs which may include one or more N-type MOSFETs, and/or one or more P-type MOSFETs. In some embodiments, the device structure 100 as shown in FIG. 1 may be integrated to function as a CMOS unit (cell 1) including N-type and P-type transistor devices.

In some embodiments, the device structure 100 includes a substrate 10, one or more fin structures 11, 12, one or more gate structures 30, and a dielectric unit 40. The fin structures 11 are disposed on the substrate 10, are each elongated in an X direction (as indicated in FIG. 1), and are spaced apart from each other in a Y direction transverse (e.g., perpendicular) to the X direction. In some embodiments, based on the type of each of the transistor devices, the device structure 100 may further include one or more P-well regions 16 (doped with p-type impurities) and one or more N-well regions 18 (doped with n-type impurities). For example, a well region beneath an N-type transistor device is a P-well region, and a well region beneath a P-type transistor device is an N-well region.

In some embodiments, the substrate 10 may be made of elemental semiconductor materials, such as crystalline silicon (Si), diamond, or germanium (Ge); compound semiconductor materials, such as gallium nitride (GaN), silicon carbide (SiC), gallium arsenide (GaAs), indium arsenide (InAs), or indium phosphide (InP); or alloy semiconductor materials, such as silicon germanium (SiGe), silicon germanium carbide, gallium arsenic phosphide (GaAsP), or gallium indium phosphide (GaInP). The material for forming the substrate 10 may be doped with p-type impurities or n-type impurities, or undoped. In addition, the substrate 10 may be a bulk silicon substrate, a silicon-on-insulator (SOI) substrate, or a germanium-on-insulator (GOI) substrate. Other suitable materials and/or configurations for the substrate 10 are within the contemplated scope of the present disclosure.

Each of the fin structures 11, 12 includes a first fin portion 11A, 12A and a second fin portion 11B, 12B. In this embodiment, each the first fin portions 11A, 12A and each of the second fin portions 11B, 12B has a substantially same width (W1) in the Y direction.

The P-well regions 16 and N-well regions 18 may each has a portion in the substrate 10 and a portion in a corresponding one of the fin structures 11, 12, and thus possible materials for the P-well regions 16 and N-well regions 18 may include elemental semiconductor materials, compound semiconductor materials or alloy semiconductor materials for the substrate 10 as described above and are each further doped with a suitable type of impurities. In some other embodiments, the P-well regions 16 and N-well regions 18 may not presented.

In the embodiment of FIG. 1, three gate structures 30 (which are also denoted by 30A, 30B and 30C) are present. Each of the gate structures 30A, 30B and 30C is elongated in the Y direction (as indicated in FIG. 1) to terminate at two opposite ends.

Further referring to FIG. 3 which illustrates the gate structure 30A as an example, the gate structure 30A is formed on the first fin portion 11A of the fin structure 11, and the first fin portion 12A of the fin structure 12.

Each of the first fin portion 11A of the fin structure 11 and the first fin portion 12A of the fin structure 1 includes two source/drain features 25 disposed at two opposite sides of the gate structure 30A (in the X direction as indicated in FIG. 1), and a channel portion 22 covered by the gate structure 30A. The source/drain features 25 are respectively disposed beneath source/drain contacts 28 at the two opposite sides of gate structure 30A. The gate structure 30A includes a gate electrode 33 and a gate dielectric layer 31 disposed to separate the gate electrode 33 from the channel portion 22. The channel portion 22 includes a plurality of channel layers 221 which are surrounded by the gate structure 30A. In some embodiments, the channel portion 22 may be formed using a vertical stack that includes a plurality of sheets or wires, but is not limited as such. In some embodiments, the gate electrode 33 includes a metal material (e.g., tungsten (W), titanium (Ti), tantalum (Ta), aluminum (Al), or ruthenium (Ru)), metal-containing nitrides (e.g., titanium nitride (TiN), or tantalum nitride (TaN)), metal-containing silicides (e.g., nickel silicide (NiSi)), metal-containing carbides (e.g., tantalum carbide (TaC)), or combinations thereof. Other suitable materials for the gate electrode 33 are within the contemplated scope of the present disclosure. In some embodiments, the gate dielectric layer 31 of each of the gate structures 30 includes silicon oxide, silicon nitride, silicon oxynitride, a suitable high-k material (such as hafnium oxide, zirconium oxide, zirconium aluminum oxide, hafnium aluminum oxide, hafnium silicon oxide, aluminum oxide, and so on), other suitable materials, or combinations thereof. Other suitable materials for the gate dielectric layer 31 are within the contemplated scope of the present disclosure. In some embodiments, the channel layers 221 may include silicon, germanium, silicon germanium, or other suitable materials.

It is noted that each of the gate structures 30B, 30C is formed on the second fin portions 11B, 12B of the fin structure 12, the structures of the gate structures 30B and 30 C may be similar to that of the gate structure 30A, and the structures of the second fin portions 11B, 12B may be similar to those of the first fin portions 11A, 12A. Each of the gate structures 30A, 30B, 30C has two parts 301 and 302 respectively disposed on the fin structures 11, 12, and thus the device structure 100 includes a plurality of the channel portions 22 and a plurality pairs of the source/drain features 25 each pair of which are disposed at two opposite sides of a corresponding one of the parts 301, 302 of the gate structures 30A, 30B, 30C. Each of the channel portions 22 is disposed between a corresponding pair of the source/drain features 25, and is surrounded by the corresponding one of the parts 301, 302, of the gate structures 30A, 30B, and 30C.

The source/drain features 25 may be respectively formed by an epitaxial growth process including CVD, molecular-beam epitaxy (MBE), an epitaxial deposition/partial etch process, such as a cyclic deposition-etch (CDE) process and/or a selective epitaxial growth (SEG) process, but is not limited thereto. It is noted that each of the source/drain features 25 may refer to a source or a drain, individually or collectively dependent upon the context. Each pair of the source/drain features 25 may include silicon, germanium, silicon germanium, or other suitable materials, and may be independently doped with n-type impurities (for N-type transistor devices) or p-type impurities (for P-type transistor devices), and may be formed as a single layer structure or a multi-layered structure having several sub-layers with different doping concentration.

In some embodiments, the dielectric unit 40 includes one or more dielectric portions 42. In some embodiments, the dielectric unit 40 further includes a front dielectric wall 41A and a rear dielectric wall 41B. The front dielectric wall 41A is formed at a front side of each of the gate structures 30A, 30B and 30C, and is elongated in the X direction. The rear dielectric wall 41B is formed at a rear side of each of the gate structures 30A, 30B and 30C, and is elongated in the X direction.

In the embodiment of FIG. 1, six dielectric portions 42 (which are also denoted by 42A, 42B, 42C, 42D, 42E and 42F) are present. Each of the dielectric portions 42 has two sides opposite to each other in the X direction. Each of the dielectric portions 42A, 42C and 42E extends from the front dielectric wall 41A in the Y direction, and each of the dielectric portions 42B, 42D and 42F extends from the rear dielectric wall 41B in the Y direction. The dielectric portions 42A and 42B extend in the Y direction to be connected to the two opposite ends of the gate structure 30A, respectively, the dielectric portions 42C and 42D extend in the Y direction to be connected to the two opposite ends of the gate structure 30B, respectively, and the dielectric portions 42E and 42F extend in the Y direction to be connected to the two opposite ends of the gate structure 30C, respectively.

In some embodiments, the dielectric portions 42A, 42C and 42E and the front dielectric wall 41A may be together formed in the form of single layer structure or a multi-layered structure having several sub-layers in a Z direction transverse (e.g., perpendicular) to the X direction and the Y direction; and the dielectric portions 42B, 42D and 42F and the rear dielectric wall 41B may be together formed in the form of single layer structure or a multi-layered structure having several sub-layers in the Z direction. The dielectric unit 40 may be made of materials such as, but not limited to, silicon nitride ($Si_3N_4$), a nitride based dielectric layer, silicon oxide (SiO2), silicon oxycarbide (SiOC), silicon oxynitride (SiON), silicon oxycarbonitride (SiOCN), a carbon content oxide, nitrogen content oxide, carbon and nitrogen content oxide, metal oxide dielectric, hafnium dioxide ($HfO_2$), tantalum oxide ($Ta_2O_5$), titanium oxide ($TiO_2$), zirconium oxide ($ZrO_2$), aluminum oxide ($Al_2O_3$), yttrium oxide ($Y_2O_3$), multiple metal content oxide, or combinations thereof.

In some embodiments, the device structure 100 further includes an inter-layer dielectric (ILD)-0 layer 60, the source/drain contacts 28, and an ILD-1 layer 50 (not shown in FIG. 1 for better illustration), a plurality of contact vias 70 and a plurality of gate contacts 71. The ILD-0 layer 60 has a plurality of ILD portions 61 covering the source/drain features 25. The source/drain contacts 28 are formed in the ILD portions 61 and are in contact with the source/drain features 25, respectively. The contact vias 70 are formed in the ILD-1 layer 50 (see FIG. 2) and are in contact with the source/drain contacts 28. The gate contacts 71 are formed in the ILD-1 layer 50 (see FIG. 3) and are in contact with the gate electrodes 33 of the gate structures 30A, 30B, 30C, respectively. The ILD-0 layer 60 and the ILD-1 layer 50 may be made of the same or different materials, and each independently include silicon oxide, silicon nitride, silicon oxynitride, silicon carbonitride/silicon carbide nitride, silicon oxycarbide, silicon oxycarbonitride, silicon carbide, boron carbon nitride, hydrogenated silicon oxycarbide, phosphosilicate glass, amorphous fluorinated carbon, boro-phosphosilicate glass, spin-on glass, fluorosilicate glass, xerogel, aerogel, parylene, divinylsiloxane-bis-benzocy-clobutene-based dielectric material, bis-benzocyclobutenes, polyimide, non-porous or porous dielectric materials. The source/drain contacts 28 may include tungsten, ruthenium, copper, other suitable materials, or combinations thereof. The contact vias 70 and the gate contacts 71 may be made of the same or different materials, and may each independently include a metal or metal-containing material such as copper, tungsten, cobalt, ruthenium, titanium, titanium nitride, tantalum, tantalum nitride, molybdenum, nickel, platinum, a low resistivity metal constituent, other suitable materials, alloys thereof, or combinations thereof.

In some embodiments, the device structure 100 further includes one or multiple pairs of gate spacers 360. In an embodiment shown in FIG. 1, each pair of the gate spacers 360 are spaced apart from each of other in the X direction and are respectively disposed on two lateral sides of a respective one of the gate structures 30A, 30B, and 30C. Each of the gate spacers 360 is elongated in the Y direction. In this manner, the pair of gate spacers 360, covering the two lateral sides of the gate structure 30A, are disposed to also cover the two sides of each of the dielectric portions 42A and 42B, respectively. The pair of gate spacers 361, covering the two lateral sides of the gate structure 30B, are disposed to also cover the two sides of each of the dielectric portions 42C and 42D, respectively. The pair of gate spacers 362, covering the two lateral sides of the gate structure 30C, are disposed to also cover the two sides of each of the dielectric portions 42E and 42F, respectively.

Possible materials for the gate spacers 36 and the dielectric unit 40 may be similar to those for the ILD-0 layer 60 listed above. In some embodiments, the dielectric unit 40 is made of a material that is different from the material of the ILD-0 layer 60, and that is different from the material of the gate spacers 36.

In some embodiments, a length of each of the dielectric portions 42A to 42F in the Y direction (i.e., a distance that each of the dielectric portions 42A to 42F extends from a corresponding one of the front dielectric wall 41A and the rear dielectric wall 41B to connect to a corresponding one of the ends of the gate structures 30A to 30C) ranges from about 3 nanometers to about 20 nanometers. A thickness of each of the front dielectric wall 41A and the rear dielectric wall 41B in the Y direction ranges from about 5 nanometers to about 20 nanometers.

Additionally, in some embodiments, the device structure 100 is configured that a shortest distance between each of the dielectric portions 42A to 42F in the Y direction and each of the channel layers 22 of a corresponding one of the channel portions 22 ranges from about 3 nanometers to about 20 nanometers. In this manner, the device structure 100 differs from a forksheet structure.

In some embodiments, the device structure 100 may further include one or more isolation walls 34. In some embodiments, the device structure 100 may further include one or more pairs of isolation spacers 38. In the embodiments of FIG. 1, three isolation walls 34 (which are also denoted by 34A, 34B and 34C), and three pairs of isolation spacers 38 (which are also denoted by 380, 381 and 382) are present. The isolation wall 34A is disposed elongated in the Y direction so as to separate the first fin portion 11A of the fin structure 11 from the second fin portion 11B of the fin structure 11, and to separate the first fin portion 12A of the fin structure 12 from the second fin portion 12B of the fin structure 12. The isolation wall 34A is elongated in the Y direction to terminate at a front wall end facing the front dielectric wall 41A and a rear wall end facing the rear dielectric wall 41B. The pair of isolation spacers 380 are spaced apart from each other in the X direction, are respectively disposed on two lateral sides of the isolation wall 34A and are each elongated in the Y direction to terminate at two ends which are in contact with the front dielectric wall 41A and the rear dielectric wall 41B, respectively. The isolation walls 34B and 34C are disposed at two lateral sides of the fin structures 11 and 12 in the X direction, so as to separate the fin structures 11 and 12 from adjacent fin structures 11C, 11D, 12C, 12D (partially shown in FIG. 1). Each of the pairs of isolation spacers 381 and 382 are spaced apart from each other in the X direction, are respectively disposed on two lateral sides of a respective one of the isolation walls 34B and 34C, and are each elongated in the Y direction to terminate at two ends which are in contact with front dielectric wall 41A and the rear dielectric wall 41B, respectively. In some embodiments, the isolation spacers 38 are made of a material that is the same as that of the gate spacers 36.

Each of the transistor devices in the device structure 100 includes one pair of the source/drain features 25, a corresponding one of the channel portions 22, and a corresponding one of the parts 301, 302 of the gate structures 30A, 30B, and 30C. In some embodiments, as shown in FIG. 3, the transistor devices on the fin structure 11 are N-type transistor devices, and the transistor devices on the fin structure 12 are P-type transistor devices. In some other embodiments, the transistor devices on the fin structure 11 are P-type transistor devices, and the transistor devices on the fin structure 12 are N-type transistor devices. Other suitable arrangements for the P-type transistor devices and N-type transistor devices are within the contemplated scope of the present disclosure.

In some alternative embodiments, additional features may be added to the device structure 100 shown in FIG. 1, and some features of the device structure 100 shown in FIG. 1 may be modified, replaced, or eliminated without departing from the spirit and scope of the present disclosure.

Figure 4:
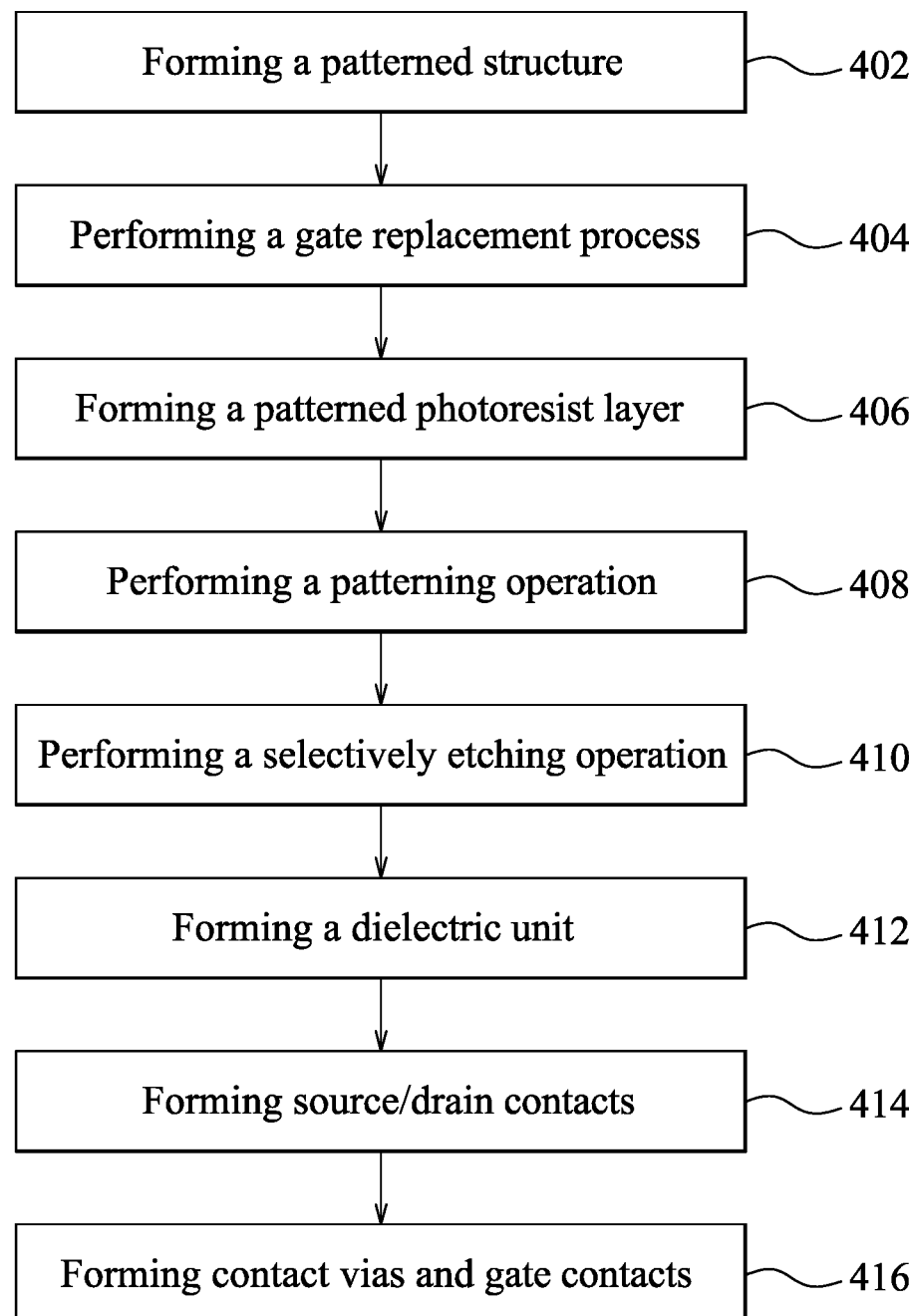
FIG. 4 is flow diagram illustrating a method for manufacturing a device structure in accordance with some embodiments.

FIG. 4 is flow diagram illustrating a method 400 for manufacturing a device structure (for example, a device structure 100 shown in FIG. 1) in accordance with some embodiments. FIGS. 5 to 12 illustrate schematic views of intermediate stages of the method 400 in accordance with some embodiments. Some repeating structures are omitted in FIGS. 5 to 12 for the sake of brevity.

Figure 5:
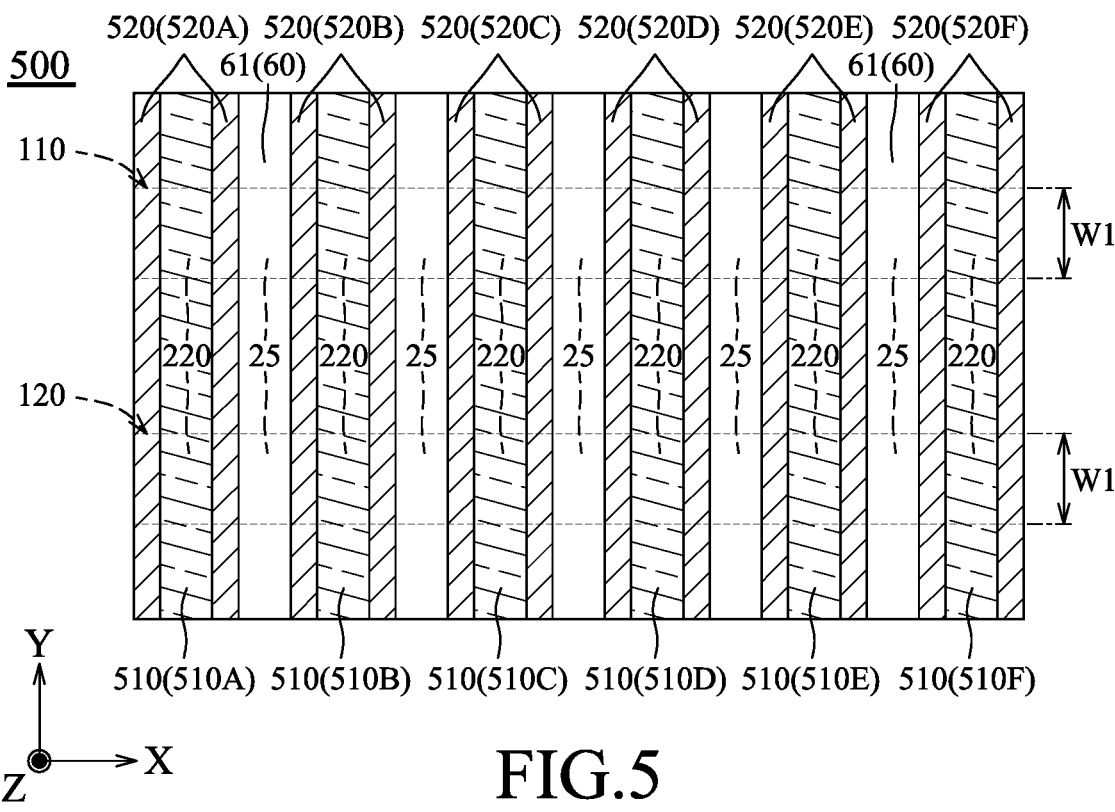
FIGS. 5 to 12 illustrate schematic views of intermediate stages of the method in accordance with some embodiments.

Referring to FIG. 4 and the example illustrated in FIG. 5, the method 400 begins at step 402, where a patterned structure 500 is formed. In some embodiments, step 402 includes sub-steps of: (i) patterning a semiconductor substrate (not shown) having the P-well regions 16 and N-well regions 18 (see FIGS. 2 and 3) and a stack unit (not shown) formed thereon to form the fins (not shown) on the substrate 10 (see FIGS. 2 and 3) (in other words, the semiconductor substrate is patterned into the substrate 10 and lower portions of the fins, and the stack unit is patterned into upper portions of the fins); (ii) forming multiple dielectric structures 19 (see FIG. 3) which are alternate with the fins in the Y direction and which cover lateral surfaces of two adjacent ones of the lower portions of the fins; (iii) forming multiple dummy structures each of which includes a dummy gate 510 (six dummy gates 510 presented in FIG. 5 are denoted as 510A, 510B, 510C, 510D, 510E, 510F, respectively), and a pair of dummy gate spacers 520 (six pairs of dummy gate spacers 520 present in FIG. 5 are denoted as 520A, 520B, 520C, 520D, 520E, 520F, respectively); (iv) recessing portions of the fins which are exposed from the dummy structures; (v) forming the source/drain features 25 on the recessed portions of the fins; (vi) forming a dielectric layer to cover the source/drain features 25 and the dummy structures, followed by a planarization process, for example, but not limited to, chemical mechanism polishing (CMP), to expose the dummy structures, and to form the dielectric layer into the ILD-0 layer 60. After sub-step (vi) of step 402, fins 110, 120 are obtained (see FIG. 5) to alternate with the dielectric structures 19 (see FIG. 3) in the Y direction, and each of the fins 110, 120 includes the source/drain features 25 and stacked structures 220 which are disposed to alternate with the source/drain features 25 in the X direction, and which are covered by the dummy structures, respectively. Each of the stacked structures 220 is formed by patterning the stack unit in sub-steps (i) and (iv) of step 402, and includes a plurality of sacrificial layers (not shown) and a plurality of the channel layers 221 (see FIG. 3) which are spaced apart from each other in the Z direction and which are disposed to alternate with the sacrificial layers in the Z direction. The dielectric structures 19 may each be a portion of a shallow trench isolation (STI), but not limited thereto. The dielectric structures 19 may include silicon oxide or other suitable materials. Each of the dummy gates 510 may include a dummy gate electrode (not shown) and a dummy gate dielectric (not shown) which is disposed to entirely separate the dummy gate electrode from a corresponding one of the stacked structures 220 of the fins 110, 120. The dummy gate electrode may include crystalline silicon, single crystalline silicon, amorphous silicon, or combinations thereof. The dummy gate dielectric may include silicon oxide, silicon nitride, silicon oxynitride, a suitable high-k material (such as the examples described in the preceding paragraph), or combinations thereof. The dummy gate spacers 520 are made of a material that is the same as the material of the gate spacers 36 and that is the same as the material of the isolation spacers 38. Other suitable materials and/or configurations for forming the dummy gates 510 are within the contemplated scope of the present disclosure. Each of the dummy gate spacers 520 are elongated in the Y direction to cover two lateral sides of a respective one of the dummy gates 510. Possible materials for the sacrificial layers are similar to those for the channel layers 221, but the sacrificial layers are made of a material different from that of the channel layers 221 so as to be selectively removed in the following step. It is noted that the formation of the above structures are known in the related art, details thereof are omitted herein for the sake of brevity.

Figure 6:
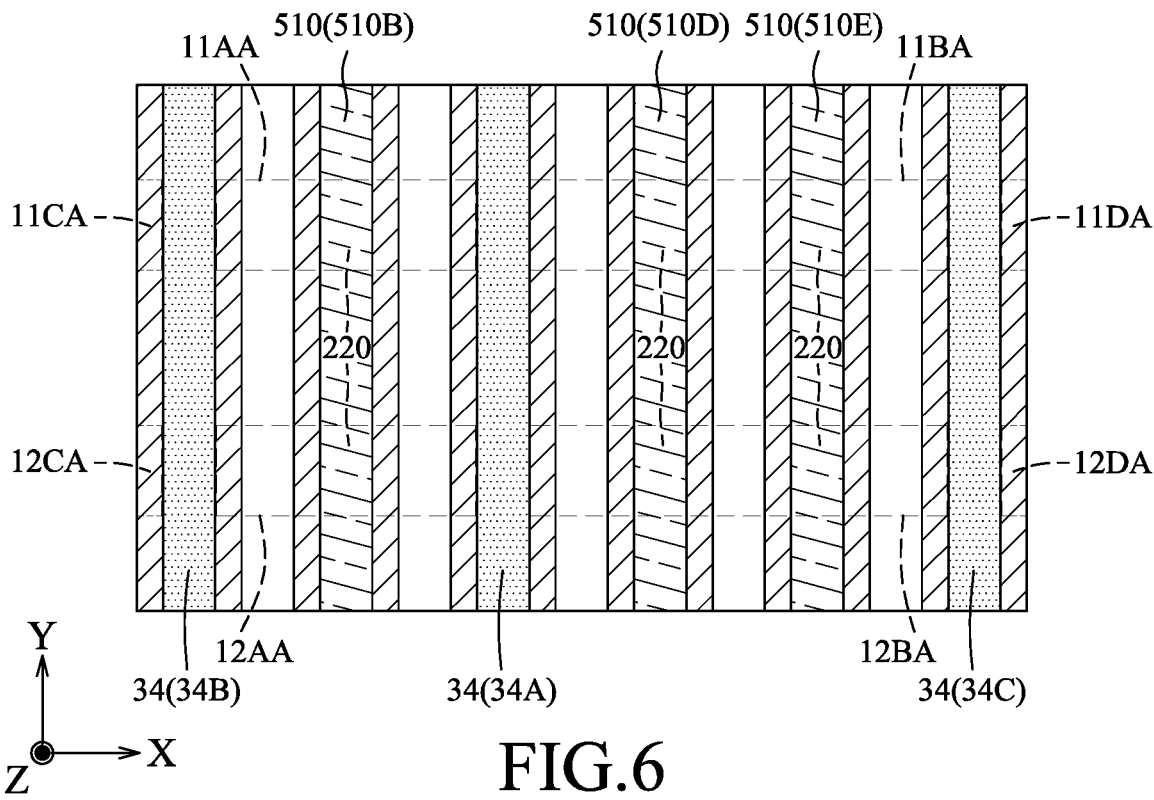

Referring to FIG. 4 and the example illustrated in FIG. 6, in some embodiments, step 402 may further include sub-step of: (vii) of removing one or more of the dummy gates 510 and portions of the fins 110, 120 beneath the one or more of the dummy gates 510 until the dielectric structures 19 (see FIG. 3) are exposed to form one or more grooves (not shown); (viii) depositing a material for forming the isolation wall(s) 34 on the dummy structures and the ILD-0 layer 60 to fill the groove(s); and (xi) performing a planarization process, for example, but not limited to, CMP to expose the ILD-0 layer 60 so as to obtain the isolation wall(s) 34. In the example of FIG. 6, three dummy gates 510A, 510C and 510F shown in FIG. 5 are removed, and then three isolation walls 34 (denoted as 34A,34B, and 34C, respectively) are formed. This operation may be done to "isolate" different devices along the X direction, so as to reduce the potential parasite capacitances between devices. After sub-step (xi) of step 402, the fins 110, 120 shown in FIG. 5 are formed into fin portions 11AA, 11BA, 11CA, 11DA, 12AA, 12BA, 12CA and 12DA. It is noted that the while the structure of FIG. 6 will be adopted for the description of the subsequent stages of the method, the structure of FIG. 5 may also be employed. In other words, sub-steps (vii) to (xi) of step 402 may be omitted.

Figure 7:
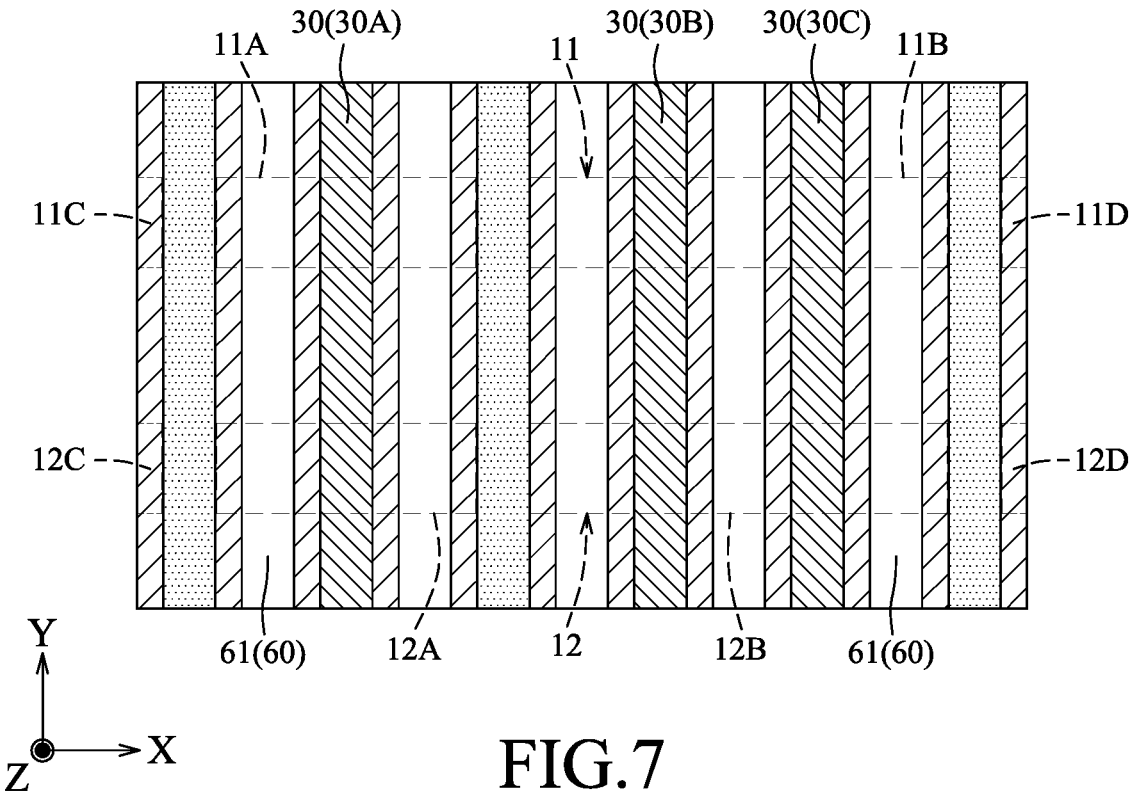

Referring to FIG. 4 and the example illustrated in FIG. 7, the method 400 proceeds to step 404, where a gate replacement process is performed to obtain the gate structures 30. In some embodiments, step 404 includes sub-steps of: (i) removing the remaining dummy gates 510 (e.g., the dummy gates 510B, 510D, 510E shown in FIG. 6) to form upper trenches (not shown); (ii) selectively removing the sacrificial layers (not shown) of the stacked structures 220 (see FIG. 6) to form lower trenches (not shown) located respectively beneath the upper trenches, whilst keeping the channel layers 221 (see FIG. 3) intact; (iii) sequentially depositing materials for forming the gate dielectric layer 31 and the gate electrode 33 (which are described with reference to FIG. 3) to fill the upper and lower trenches; and (iv) performing a planarization process, for example, but not limited to, CMP, to remove excess materials for forming the gate dielectric layer 31 and the gate electrode 33 and to expose the ILD-0 layer 60. In the example shown in FIG. 7, after sub-step (iv) of step 404, the three gate structures 30A, 30B and 30C are formed in replacement of the three dummy gates 510B, 510D and 510F shown in FIG. 6. In addition, after sub-step (iv) of step 404, the fin portions 11AA, 11BA shown in FIG. 6 are respectively formed into the first and second fin portions 11A, 11B of the fin structure 11 (see also FIG. 1), the fin portions 11CA, 11DA are respectively formed into the fin structures 11C, 11D, the fin portions 12AA, 12BA are respectively formed into the first and second fin portions 12A, 12B of the fin structure 12, and the fin portions 12CA, 12DA are respectively formed into the fin structures 12C, 12D. In some embodiments, referring to FIG. 3, the gate electrode 33 of the part 301 and the gate electrode 33 of the part 302 may be made of the same material (i.e., the gate electrode 33 on the fin structure 11 may be formed together with the gate electrode 33 on the fin structure 12). In some other embodiments, the gate electrode 33 of the part 301 and the gate electrode 33 of the part 302 may be made of different materials. That is to say, the gate electrode 33 on the fin structure 11 and the gate electrode 33 on the fin structure 12 may be separately formed. For example, in sub-step (iii) of step 404, after depositing the material for forming the gate dielectric layer 31, a patterned mask (not shown) is formed, the material for the gate electrode 33 of one of the parts 301, 302 is deposited, and then the patterned mask is removed, followed by depositing the material for the gate electrode 33 of the other one of the parts 301, 302.

Figure 8:
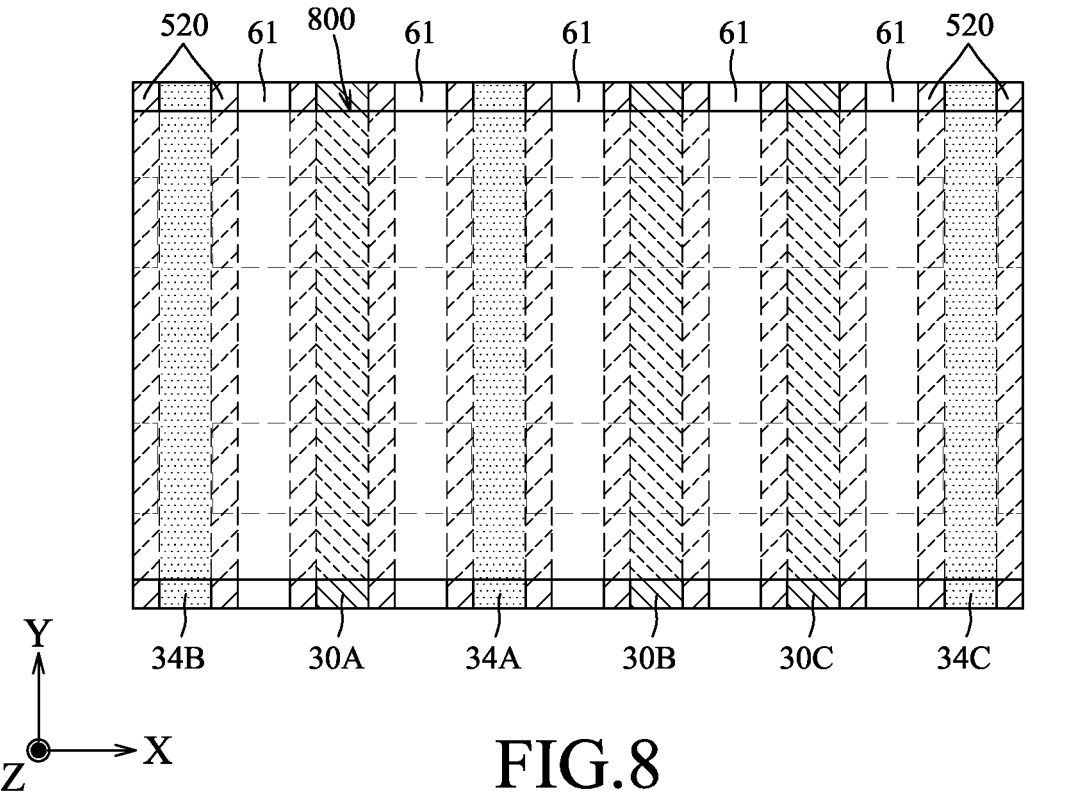

Referring to FIG. 4 and the example illustrated in FIG. 8, the method 400 proceeds to step 406, where a patterned photoresist layer 800 is formed on a top surface of the structure shown in FIG. 7 (along the direction Z as indicated in FIG. 8). The patterned photoresist layer 800 covers a part of the top surface of the structure shown in FIG. 7 and leaves a front part and a rear part of the top surface the structure shown in FIG. 7 exposed. In this manner, each of the gate structures 30A, 30B and 30C, the isolation walls 34A, 34B and 34C, the dummy gate spacers 520, and the ILD portions 61 has a front part and a rear part that are exposed from the patterned photoresist layer 800. The patterned photoresist layer 800 may include a polymer material, and may be formed by coating a photoresist layer (not shown) on the top surface of the structure shown in FIG. 7 using, for example, spin coating, exposing the photoresist layer through a photomask (not shown), followed by developing the photoresist layer.

Figure 9:
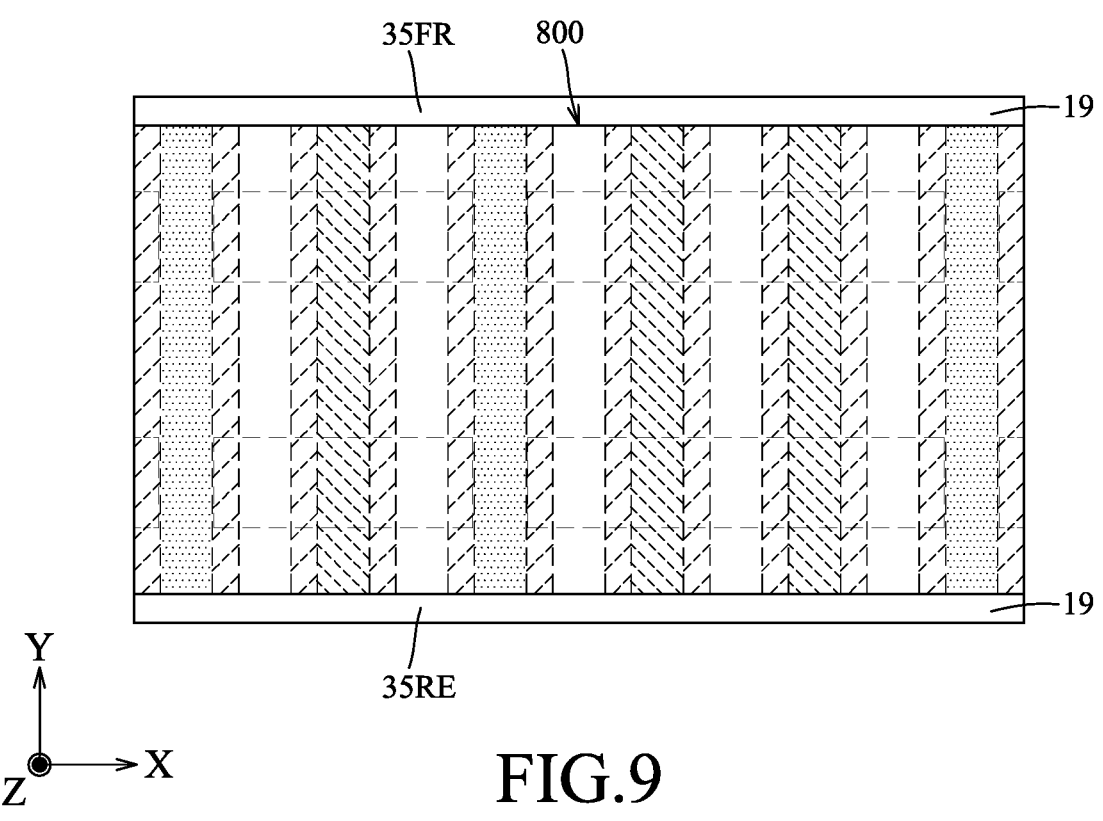

Referring to FIG. 4 and the example illustrated in FIG. 9, the method 400 proceeds to step 408, where a patterning operation is performed. In the example of FIG. 9, step 408 is performed using one or multiple etching processes (such as a dry etching process, a wet etching process, other suitable processes, or combinations thereof) for removing the front and rear parts of each of the gate structures 30A, 30B and 30C, the isolation walls 34A, 34B and 34C, and the ILD portions 61 downwardly in the Z direction to form a front elongated trench 35FR and a rear elongated trench 35RE. As a result, after step 408, portions of the dielectric structures 19 are exposed.

Figure 10:
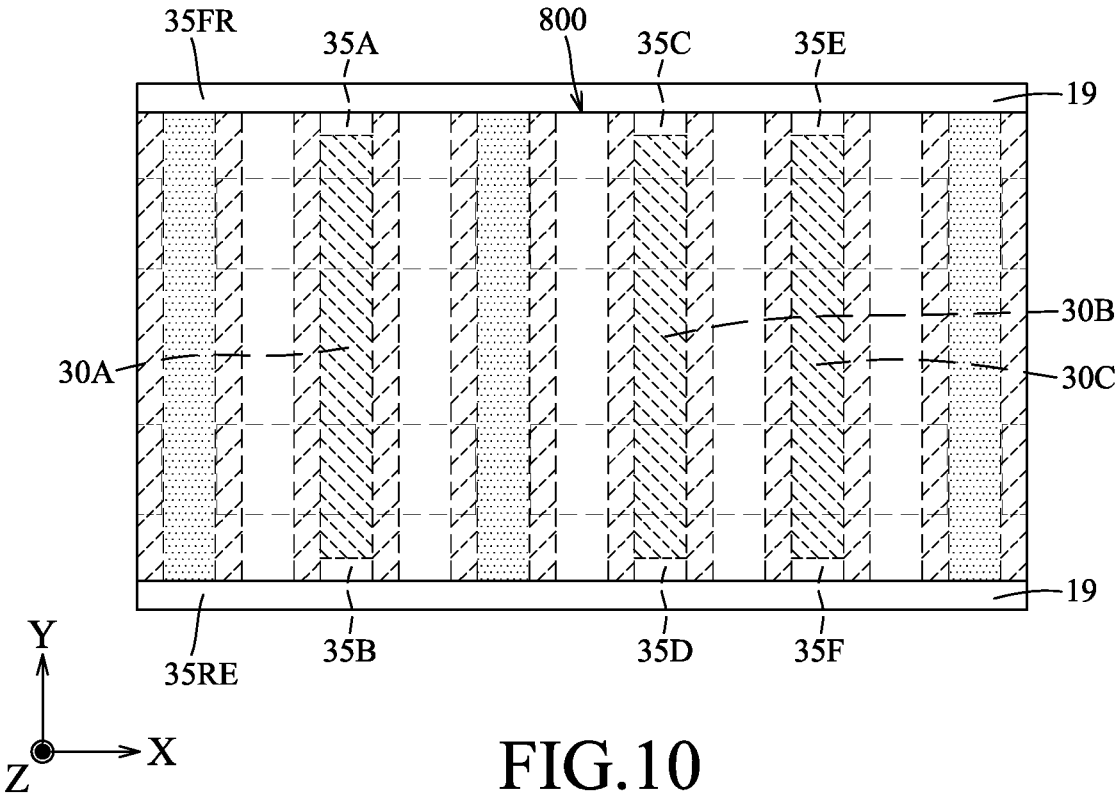

Referring to FIG. 4 and the example illustrated in FIG. 10, the method 400 proceeds to step 410, where a selective etching operation is performed to selectively etch the gate structures 30A, 30B and 30C. Specifically, in the example shown in FIG. 10, the selective etching operation includes selectively etching the gate structures 30A, 30B and 30C using a suitable etching process (such as a dry etching process, a wet etching process, other suitable processes, or combinations thereof) along the Y direction and downwardly in the Z direction to form recesses 35A, 35B, 35C, 35D, 35E and 35F, while leaving other components unaltered. That is to say, from the top view of FIG. 10, each of the gate structures 30A, 30B and 30C is "shrunk" in the Y direction. After step 410, the patterned photoresist layer 800 is removed using, for example, wet stripping or plasma ashing.

Figure 11:
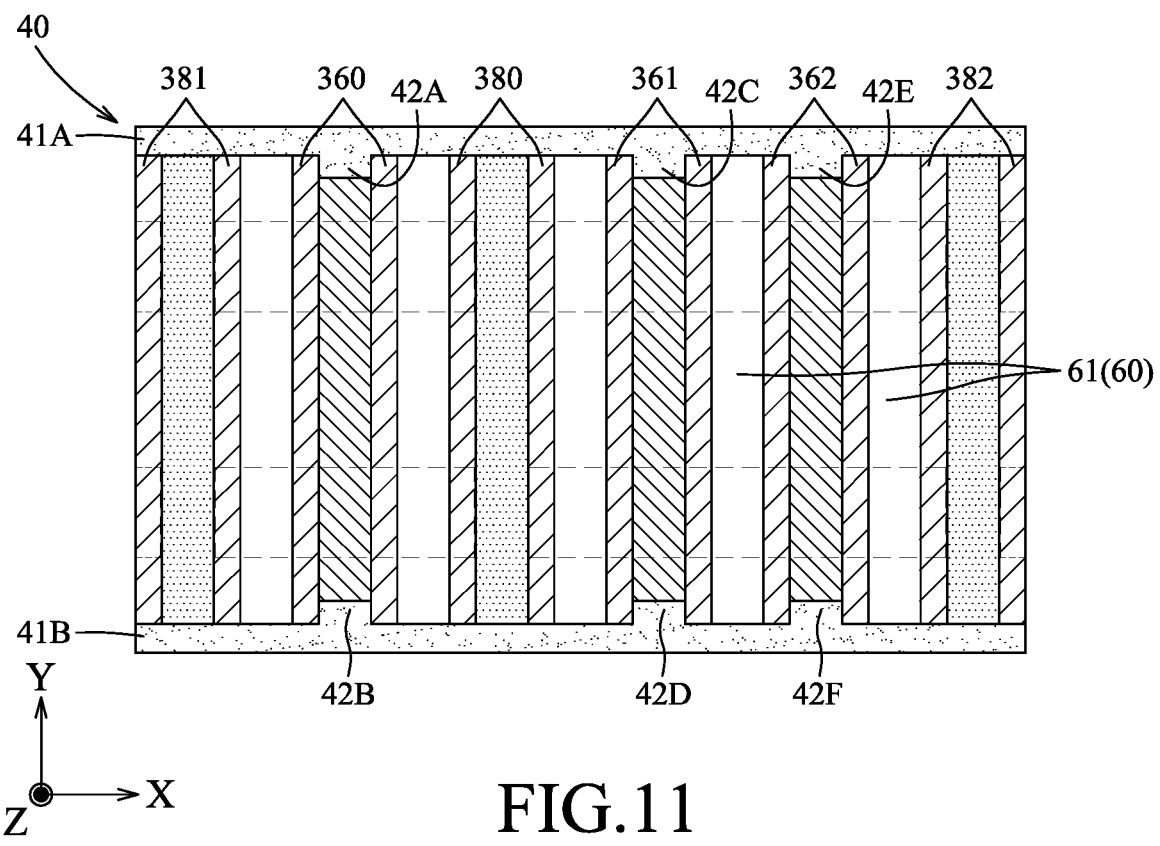

Referring to FIG. 4 and the example illustrated in FIG. 11, the method 400 proceeds to step 412, where the dielectric unit 40 is formed. In some embodiments, step 412 includes (i) depositing a material for forming the dielectric unit 40 using, for example, physical vapor deposition (PVD), chemical vapor deposition (CVD), atomic layer deposition (ALD), molecular-beam deposition (MBD), or other suitable deposition processes to fill the front and rear elongated trenches 35FR, 35RE and the recesses 35A, 35B, 35C, 35D, 35E and 35F (see FIG. 10), and (ii) performing a planarization process, for example, but not limited to, CMP to remove excess materials for forming the dielectric unit 40 so as to expose the ILD-0 layer 60. After step 412, the front dielectric wall 41A and the rear dielectric wall 41B are respectively formed in the front and rear elongated trenches 35FR, 35RE to cover the dielectric structures 19 (see also FIG. 10), and the dielectric portions 42A, 42B, 42C, 42D, 42E and 42F are respectively formed in the recesses 35A, 35B, 35C, 35D, 35E and 35F (see FIG. 10). It is noted that at this stage, the dummy gate spacers 520A, 520C and 520F formed in step 402 (see FIG. 5) serve as the isolation spacers 381, 380 and 382 in FIG. 11, respectively, and the dummy gate spacers 520B, 520D and 520E formed in step 402 (see FIG. 5) serve as the gate spacers 360, 361 and 362 in FIG. 11, respectively.

Figure 12:
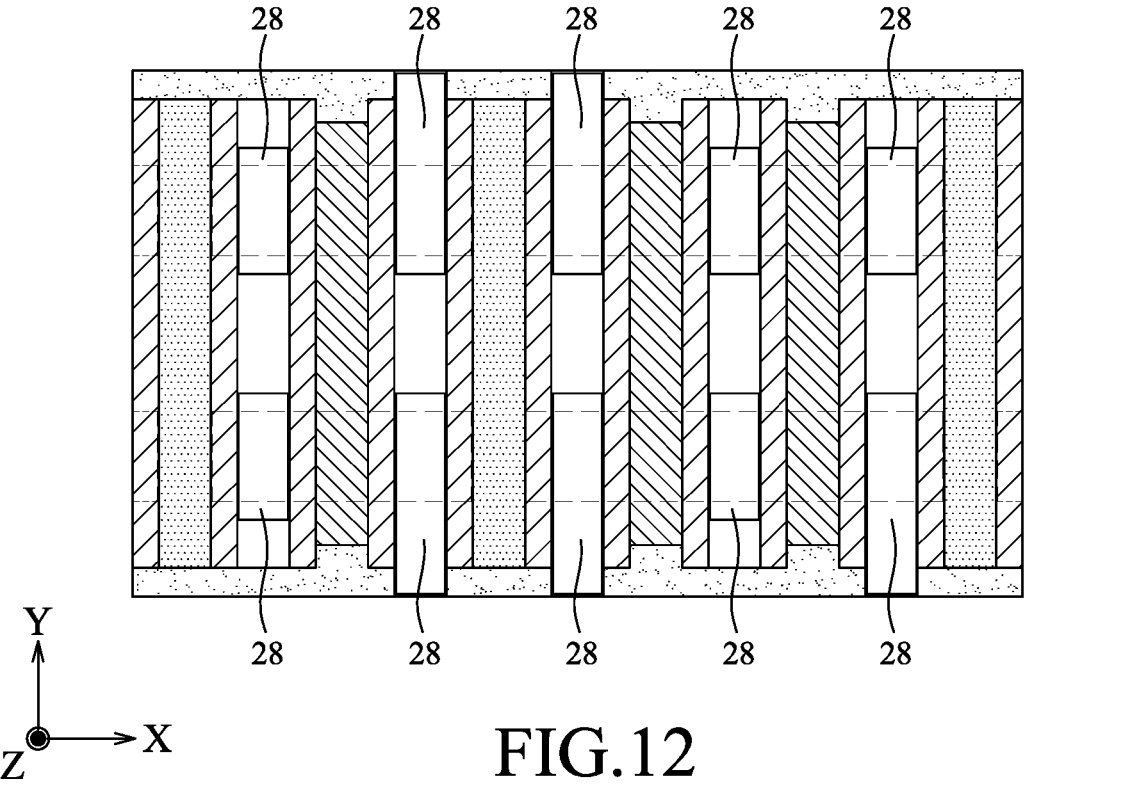

Referring to FIG. 4 and the examples illustrated in FIGS. 2 and 12, the method 400 proceeds to step 414, where the source/drain contacts 28 are respectively formed to be in contact with the source/drain features 25. In some embodiments, step 414 includes sub-steps of: (i) patterning the ILD-0 layer 60 through a first patterned photoresist layer (not shown) using a suitable etching process (such as a dry etching process, a wet etching process, other suitable processes, or combinations thereof) downwardly in the Z direction to form contact openings (not shown) which respectively expose the source/drain features 25; (ii) removing the first patterned photoresist layer using wet stripping or plasma ashing; (iii) depositing a material for forming the source/drain contacts 28 using, for example, PVD, CVD, ALD, MBD, or other suitable processes to fill the contact openings, and (iv) performing a planarization process, for example, but not limited to, CMP to remove excess materials for forming the source/drain contacts 28 so as to expose the ILD-0 layer 60. In some embodiments, step 414 may further includes a sub-step of implanting suitable metal(s) into the source/drain features 25 through the contact openings to form metal silicide features 27 (see FIG. 2) between each of the source/drain features 25 and a corresponding one of the source/drain contacts 28 for reducing a contact resistance (Rcsd) therebetween. In other embodiments, before sub-step (i), step 414 may further include a sub-step of forming a lower part of the ILD-1 layer 50 to cover the structure shown in FIG. 11 and thus, as shown in FIG. 2, the source/drain contacts 28 are formed in the ILD-0 layer 60 and the lower part of the ILD-1 layer 50 and in sub-step (i) of step 414, the contact openings (not shown) are formed by patterning in the lower part of the ILD-1 layer 50 and the ILD-0 layer 60. In some embodiments, in sub-step (i) of step 414, the contact openings (not shown) are formed by patterning the lower part of the ILD-1 layer 50, the ILD-0 layer 60 and the dielectric unit 40, and thus some of the source/drain contacts 25 are also formed in the front dielectric wall 41A or the rear dielectric wall 41B.

Referring to FIG. 4 and the examples illustrated in FIGS. 1 and 2, the method 400 proceeds to step 416, where the contact vias 70 and the gate contacts 71 are formed. In some embodiments, step 416 may include sub-steps of: (i) depositing an upper part of the ILD-1 layer 50 to cover the lower part of the ILD-1 layer 50 and the source/drain contacts 28 using PVD, CVD, ALD or other suitable techniques; (ii) patterning the upper and lower parts of the ILD-1 layer 50 through a second patterned photoresist layer (not shown) using a suitable etching process (such as a dry etching process, a wet etching process, other suitable processes, or combinations thereof) downwardly in the Z direction; (iii) depositing one or more material suitable for forming the contact vias 70 and the gate contacts 71 (as described above) using, for example, PVD, CVD, ALD, or other suitable processes; and (iv) performing a planarization process, for example, but not limited to, CMP to remove excess material for forming the contact vias 70 and the gate contacts 71 and to expose the ILD-1 layer 50, thereby obtaining the contact vias 70 and the gate contacts 71. As such, the method for manufacturing a device structure 100 as shown in FIG. 1 is completed.

Figure 13:
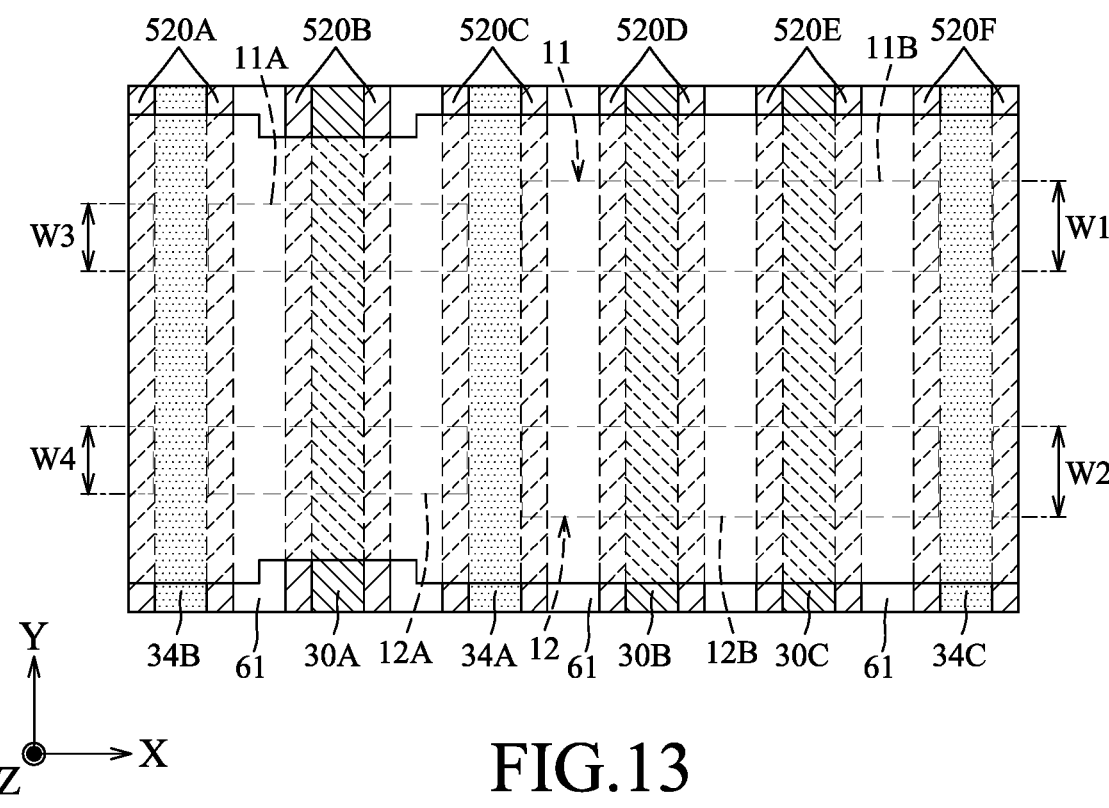
FIGS. 13 to 18 illustrates schematic views of intermediate stages of the method in accordance with modified embodiments.

In some embodiments, some steps in the method 400 may be modified, replaced, or eliminated without departure from the spirit and scope of the present disclosure. For example, FIGS. 13 to 18 illustrates schematic views of intermediate stages of the method 400 in accordance with modified embodiments. Although the example in FIG. 5 illustrates step 402 of method 400 in accordance with some embodiments, each of the fins 110, 120 may have two portions which are spaced apart in the X direction and which have the same width in the Y direction, and the two portions of each of the fins 110, 120 in the modified embodiments may have different widths in the Y direction. Thus, the example in FIG. 13 illustrates step 406 of method 400 in accordance with the modified embodiments, in which the first fin portion 11A, the second fin portion 11B, the first fin portion 12A and the second fin portion 12B have widths W3, W1, W4, W2, respectively. Each of the widths W1 and W2 is longer than each of the widths W3 and W4. In some embodiments, a ratio of the width W1 to the width W3 ranges from about 1.2 to about 5, and a ratio of the width W2 to the width W4 ranges from about 1.2 to about 5.

Figure 14:
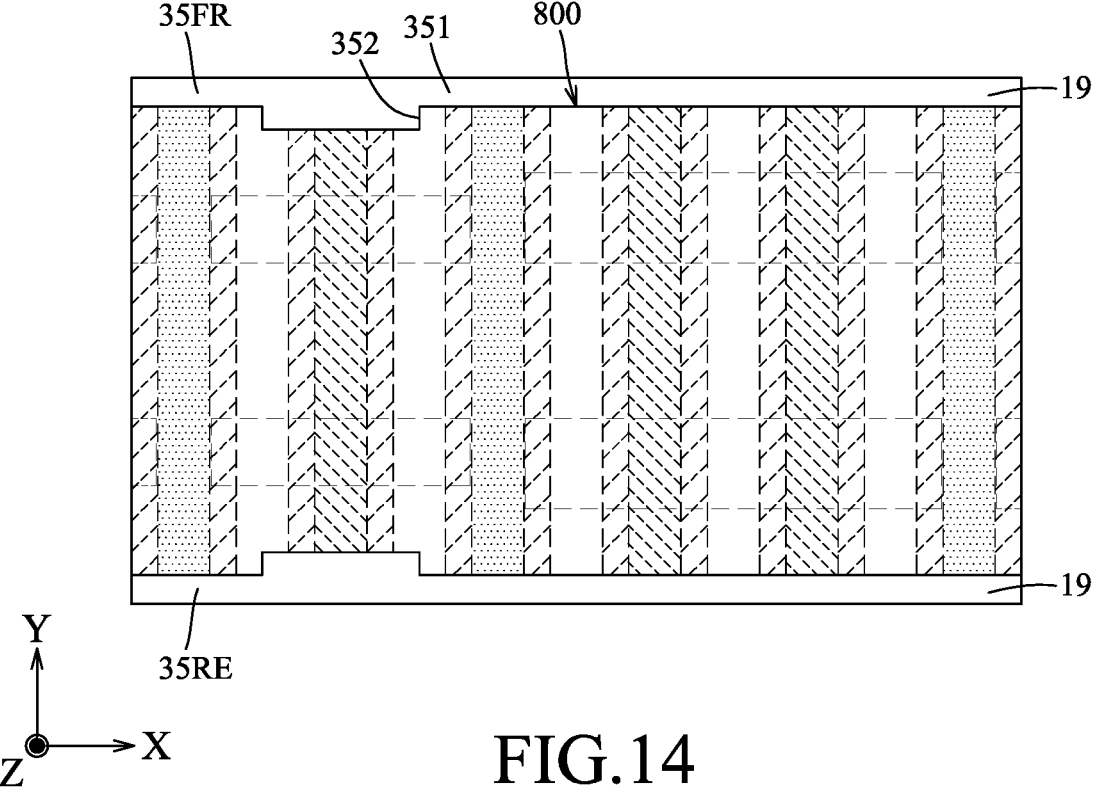
Figure 15:
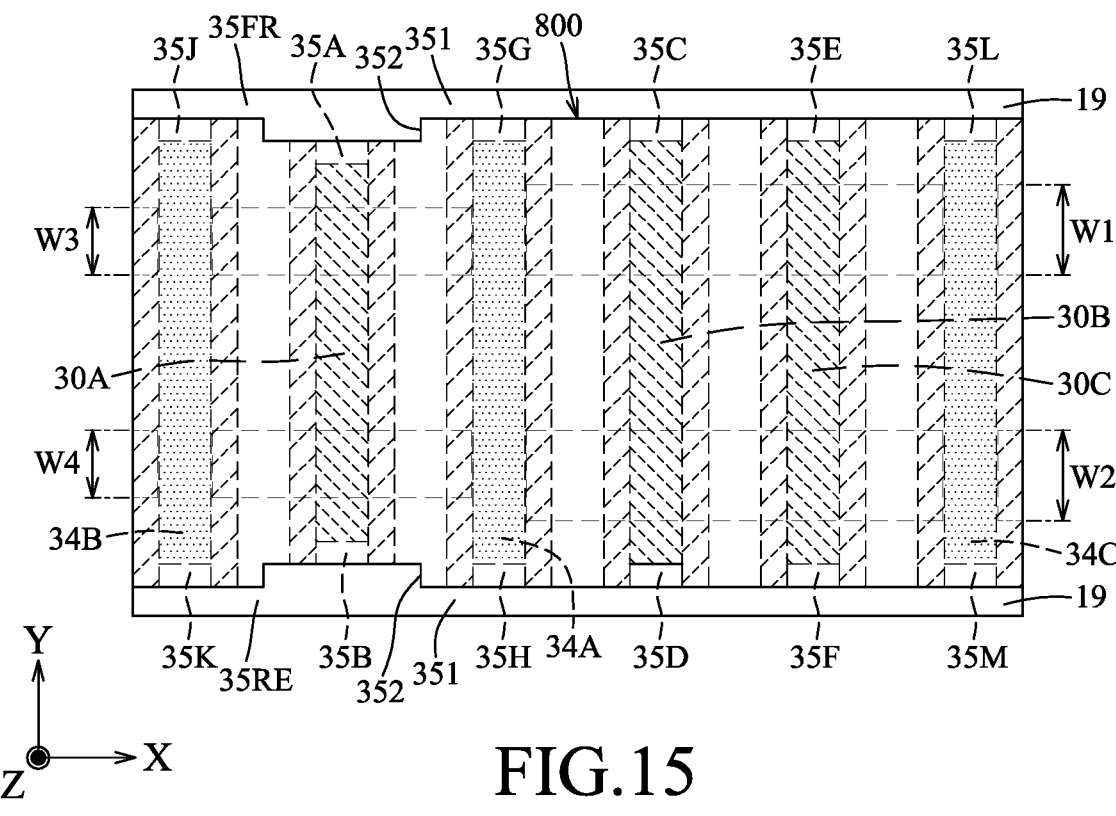

In addition, as shown in FIG. 13, the gate structures 30A, 30B and 30C, the isolation walls 34A, 34B and 34C, the dummy gate spacers 520A to 520F, and the ILD portions 61 each has a front part and a rear part that are exposed from the patterned photoresist layer 800, but an area of each of the front part and rear part of the gate structure 30A, and the dummy gate spacers 520B are larger than those shown in FIG. 8. As a result, in step 408, from the top view of the structure as shown in FIG. 14, each of the gate structures 30A, 30B and 30C is "shrunk" in the Y direction, with the gate structure 30A shrinking greater than that of each of the gate structures 30B and 30C, and each of the front and rear elongated trenches 35FR, 35RE formed in step 408 has an elongated trench portion 351 which is elongated in the X direction, and an extended trench portion 352 extended in the Y direction to be in spatial communication with the elongated trench portion 351. Afterward, in step 410, the selective etching operation is performed to selectively etch the gate structures 30A, 30B and 30C to form recesses 35A, 35B, 35C, 35D, 35E and 35F. In some embodiments, from the top view of the structure as shown in FIG. 15, step 410 may further include another selective etching operation, which is performed to selectively etch the isolation walls 34A, 34B and 34C along the Y direction and downwardly in the Z direction, so as to form recesses 35G, 35H, 35J, 35K, 35L and 35M, and then removing the patterned photoresist layer 800.

Figure 16:
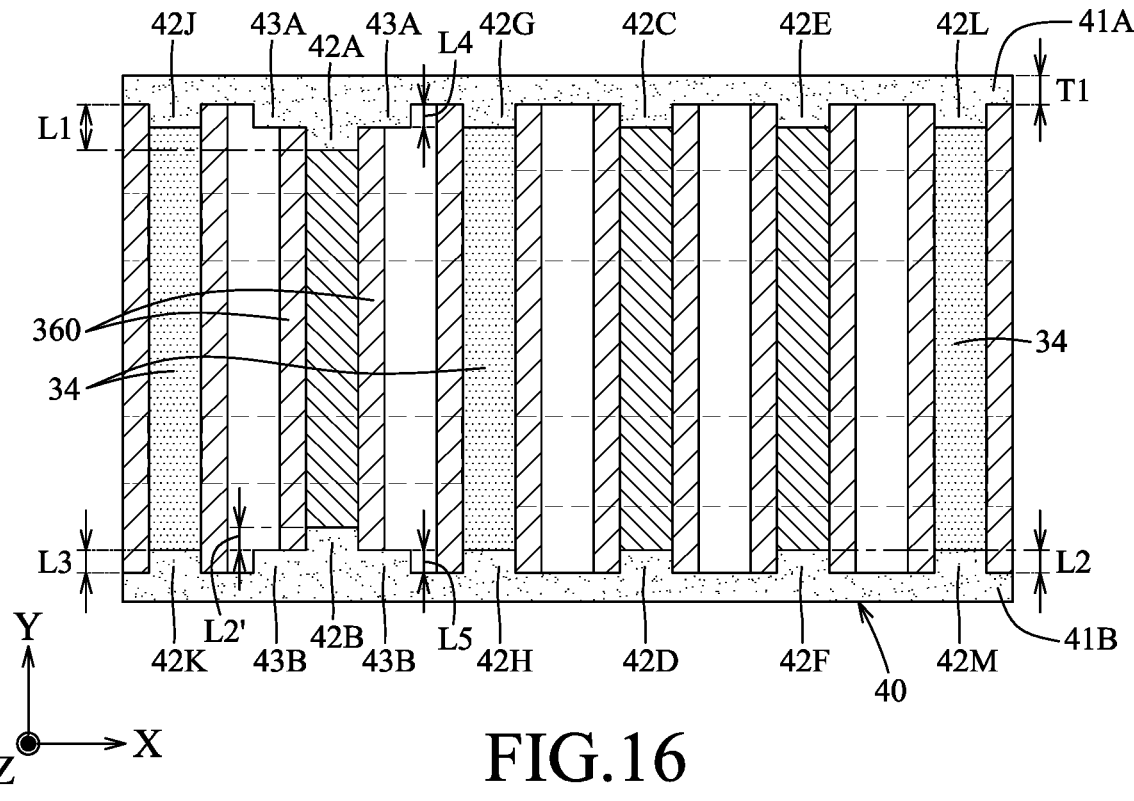
Figure 17:
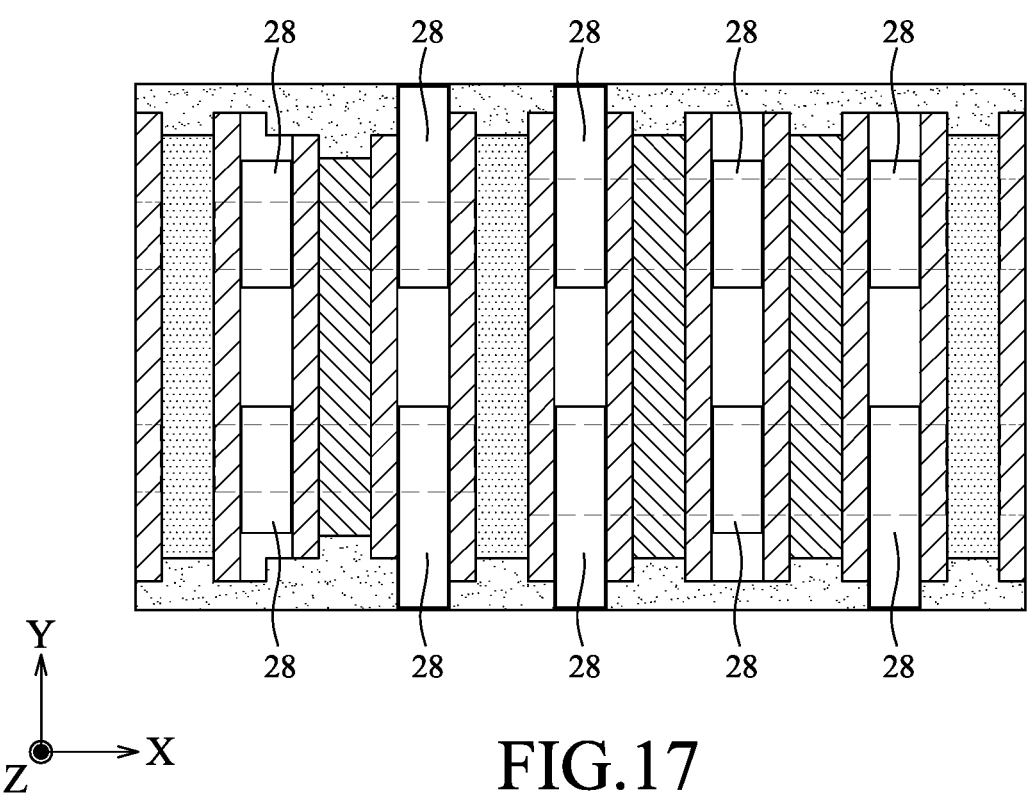
Figure 18:
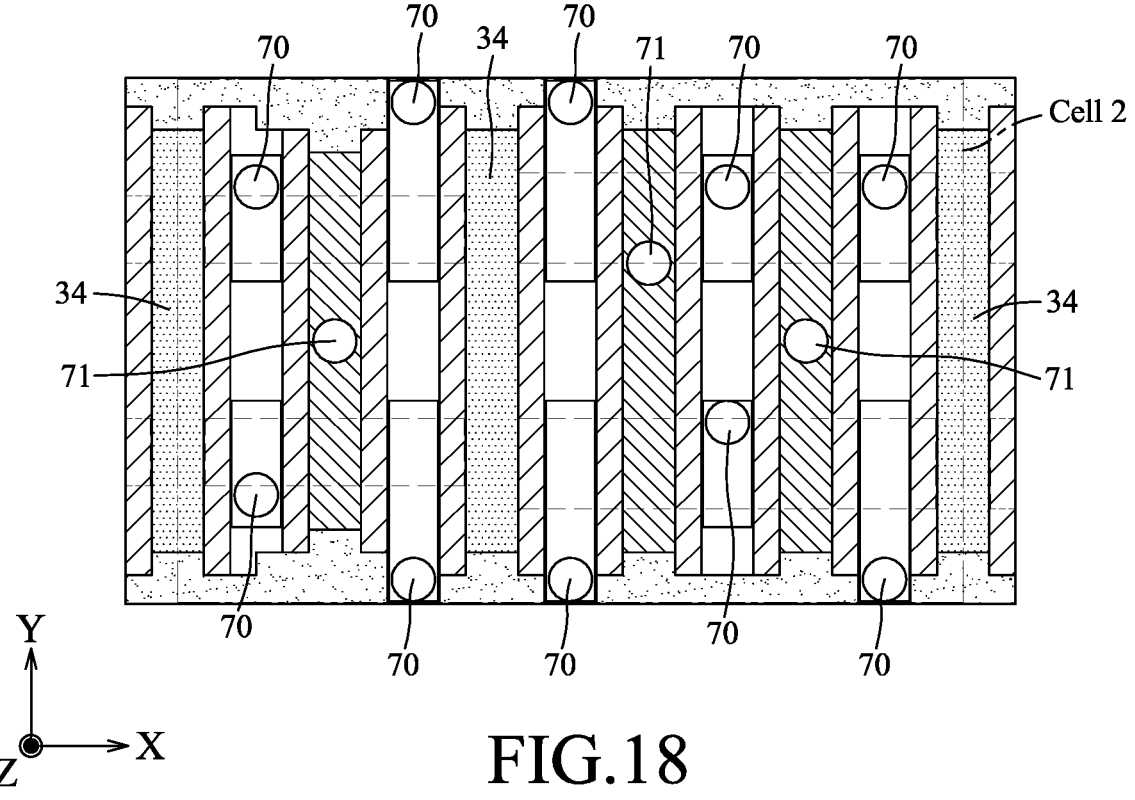

Then, in step 412 of the modified embodiment, the dielectric unit 40 is formed in a manner similar to step 412 of the method of FIG. 4 with reference to FIG. 11. After step 412, as shown in FIG. 16, the front dielectric wall 41A and the rear dielectric wall 41B are respectively formed in the elongated trench portions 351 of the front and rear elongated trenches 35FR, 35RE to cover the dielectric structures 19 (see also FIG. 15), the dielectric portions 42A, 42B, 42C, 42D, 42E and 42F are respectively formed in the recesses 35A, 35B, 35C, 35D, 35E and 35F, and a plurality of dielectric portions 42G, 42H, 42J, 42K, 42L and 42M are respectively formed in the recesses 35G, 35H, 35J, 35K, 35L and 35M (see also FIG. 15). In some embodiments, the dielectric portions 42A, 42C and 42E each may be referred to a front protrusion that protrudes from the front dielectric wall 41A, and the dielectric portions 42B, 42D and 42F each may be referred to a rear protrusion that protrudes from the rear dielectric wall 41B. In some embodiments, the dielectric portions 42G, 42J and 42L each may be referred to a front dielectric jog which is disposed between the front dielectric wall 41A and a front wall end of a corresponding one of the isolation walls 34, and the dielectric portions 42H, 42K and 42M each may be referred to a rear dielectric jog which is disposed between the rear dielectric wall 41B and a rear wall end of a corresponding one of the isolation walls 34. In addition, referring to FIGS. 15 and 16, the dielectric portion 42A in the recess 35A extends through the extended trench portion 352 of the front elongated trench 35FR to be connected to the front dielectric wall 41A, and the dielectric portion 42B in the recess 35B extends through the extended trench portion 352 of the rear elongated trench 35RE to be connected to the rear dielectric wall 41B. In some embodiments, the dielectric unit 40 further includes a pair of front side blocks 43A and a pair of rear side blocks 43B. The pair of front side blocks 43A are formed in the extended trench portion 352 of the front elongated trench 35FR, and are connected to and disposed at two opposite sides of the dielectric portion 42A in the X direction. Each of the front side blocks 43A connects the front dielectric wall 41A to a respective one of the gate spacers 360. The pair of rear side blocks 43B are formed in the extended trench portion 352 of the rear elongated trench 35RE, and are connected to and disposed at two opposite sides of the dielectric portion 42B in the X direction. Each of the rear side blocks 43B connects the rear dielectric wall 41B to a respective one of the gate spacers 360. FIGS. 17 and 18 are schematic views similar to those shown in FIGS. 12 and 1, respectively, but illustrating the structures after steps 414 and 416 in accordance with the modified embodiments. In some embodiments, the device structure 100 as shown in FIG. 18 may be integrated to function as a CMOS unit (cell 2) including N-type and P-type transistor devices.

Referring to FIGS. 16 and 18, in some embodiments, a length L1 of each of the dielectric portions 42A and 42B in the Y direction (i.e., a distance that each of the dielectric portions 42A and 42B extends from a corresponding one of the front dielectric wall 41A and the rear dielectric wall 41B) ranges from about 6 nanometers to about 40 nanometers. A length L2 of each of the dielectric portions 42C to 42F in the Y direction (i.e., a distance that each of the dielectric portions 42C to 42F extends from a corresponding one of the front dielectric wall 41A and the rear dielectric wall 41B) ranges from about 3 nanometers to about 20 nanometers. A length L3 of each of the dielectric portions 42G, 42H, 42J, 42K, 42L and 42M in the Y direction (i.e., a distance that each of the dielectric portions 42G, 42H, 42J, 42K, 42L and 42M extends from a corresponding one of the front dielectric wall 41A and the rear dielectric wall 41B) ranges from about 3 nanometers to about 20 nanometers. In some embodiments, the length L3 of each of the dielectric portions 42G, 42H, 42J, 42K, 42L and 42M in the Y direction may be configured to be about the same as the length L2 of each of the dielectric portions 42C to 42F in the Y direction, or alternatively less than the length L2 of each of the dielectric portions 42C to 42F in the Y direction by a difference ranging from about 1 nanometer to about 10 nanometers. A thickness T1 of each of the front dielectric wall 41A and the rear dielectric wall 41B in the Y direction ranges from about 5 nanometers to about 20 nanometers. A first sum length includes a length L4 of each of the pair of front side blocks 43A in the Y direction (i.e., a distance that each of the pair of front side blocks 43A extends from the front dielectric wall 41A) and the thickness T1 of the front dielectric wall 41A. A ratio of the first sum length to the thickness T1 of the front dielectric wall 41A ranges from about 1.2 to about 3. A second sum length includes a length L5 of each of the pair of rear side blocks 43B in the Y direction (i.e., a distance that each of the pair of rear side blocks 43B extends from the rear dielectric wall 41B) and the thickness T1 of the rear dielectric wall 41B. A ratio of the second sum length to the thickness T1 of the rear dielectric wall 41B ranges from about 1.2 to about 3. Each of the dielectric portions 42A and 42B has a portion that is located between the gate spacers 360, and that has a length L2' in the Y direction ranging from about 3 nanometers to about 20 nanometers.

It is noted that in some embodiments, the configuration of the dielectric portions 42G, 42H, 42J, 42K, 42L and 42M may also be employed in the device structure 100 as shown in FIG. 1.

The configuration of FIG. 18 may be used such that the resulting transistor devices are formed with different characteristics (e.g., nanosheet structures with different widths). In actual use, the transistor devices with wider nanosheet structures may be used in high-speed applications, and transistor devices with narrower nanosheet structures may be used in power reducing applications. The arrangement of those transistors with the introduction of the dielectric unit 40 may ensure that the resulting parasitic capacitance is reduced. In such arrangement, the introduction of the isolation walls 34 between transistor devices formed on the fin portions with different widths may assist in reducing the potential reliability or process issues associated with the junction (i.e., the junction between the fin portions with different widths) of the transistor devices.

Figure 19:
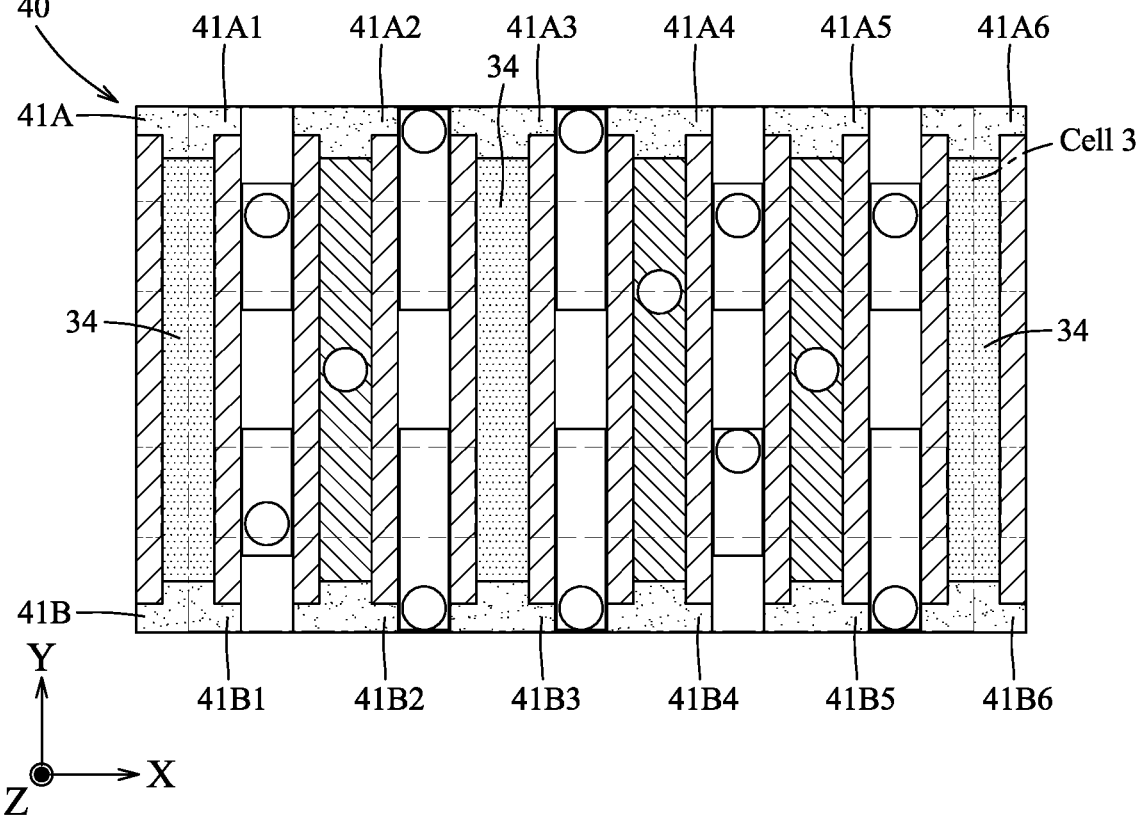
FIG. 19 illustrates another device structure in accordance with some embodiments.

FIG. 19 illustrates another device structure 100 (including a cell 3) in accordance with some embodiments. The cell 3 is similar to the cell 1 shown in FIG. 1 except the configuration of the dielectric unit 40. In this embodiment, the front dielectric wall 41A is in the form of a plurality of front wall segments (in the embodiment as shown in FIG. 19, six front wall segments 41A1, 41A2, 41A3, 41A4, 41A5, 41A6 are present) instead of a continuous wall in the X direction, and the rear dielectric wall 41B is in the form of a plurality of rear wall segments (in the embodiment as shown in FIG. 19, six rear wall segments 41B1, 41B2, 41B3, 41B4, 41B5, 41B6 are present) instead of a continuous wall in the X direction. The cell 3 may be made using a modified method similar to the method 400 as described above. For example, for forming the cell 3, the patterned photoresist layer 800 shown in FIG. 8 may fully cover the ILD portions 61. As a result, after the patterning operation of step 408 is performed, the ILD portions 61 are left intact. Subsequently, in step 412, the dielectric unit 40 as shown in FIG. 19 is formed.

Figure 20:
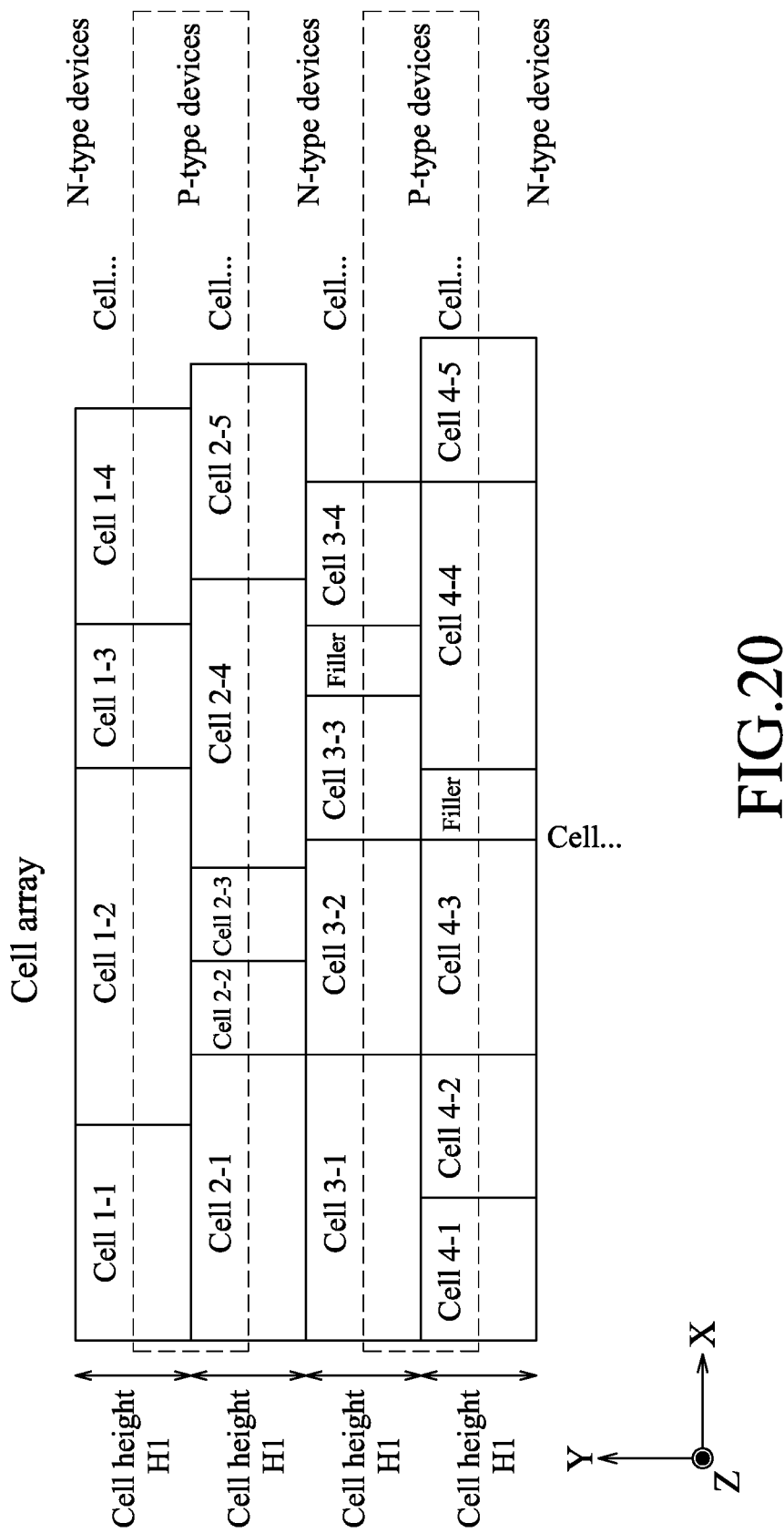
FIG. 20 illustrates a cell array layout in accordance with some embodiments.

FIG. 20 illustrates a cell array layout in accordance with some embodiments. The cell array layout is in a top view showing a number of cells that are arranged in a two-dimensional structure. The cell 1, the cell 2, and the cell 3 shown in FIGS. 1, 18 and 19 may each serve as one of the cells in the cell array layout. In some embodiments, two adjacent cells in the X direction may be separated by an isolation wall 34 as shown in FIGS. 1, 18 and 19. Alternatively, two adjacent cells may be separated by a filler, which may have a configuration similar to the isolation wall 34 and have a length in the X direction larger than that of the isolation wall 34. Generally, the filler is disposed in various location of the cell array layout so as to assist in aligning the cells, a practice known as "white space filling". In some embodiments, the filler may include parts of dummy structures (e.g., one or more of dummy gates with configuration similar to the dummy gates 510 shown in FIG. 5, or a wall with configuration similar to the isolation wall 34 shown in FIG. 19), a dummy fin structure, a dummy contact, etc. In some embodiments, a length of the filler in the X direction may be about one or more times of a contacted poly pitch (CPP). For example, for the device structure 100 shown in FIG. 1, the CPP can be determined by a distance between two adjacent ones of the dummy gates 510 shown in FIG. 5.

Figure 21:
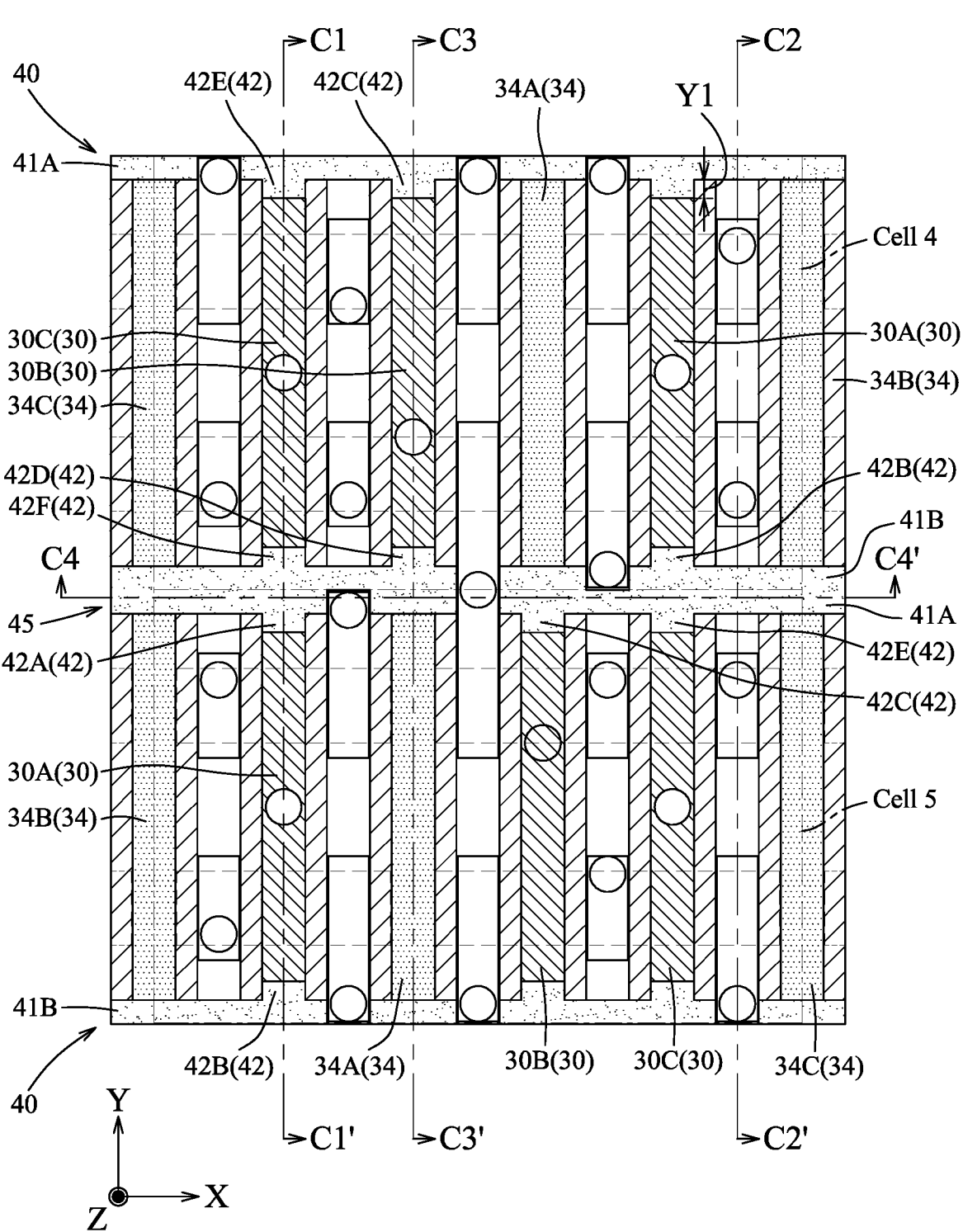
FIG. 21 illustrates yet another device structure in accordance with some embodiments.
Figure 22:
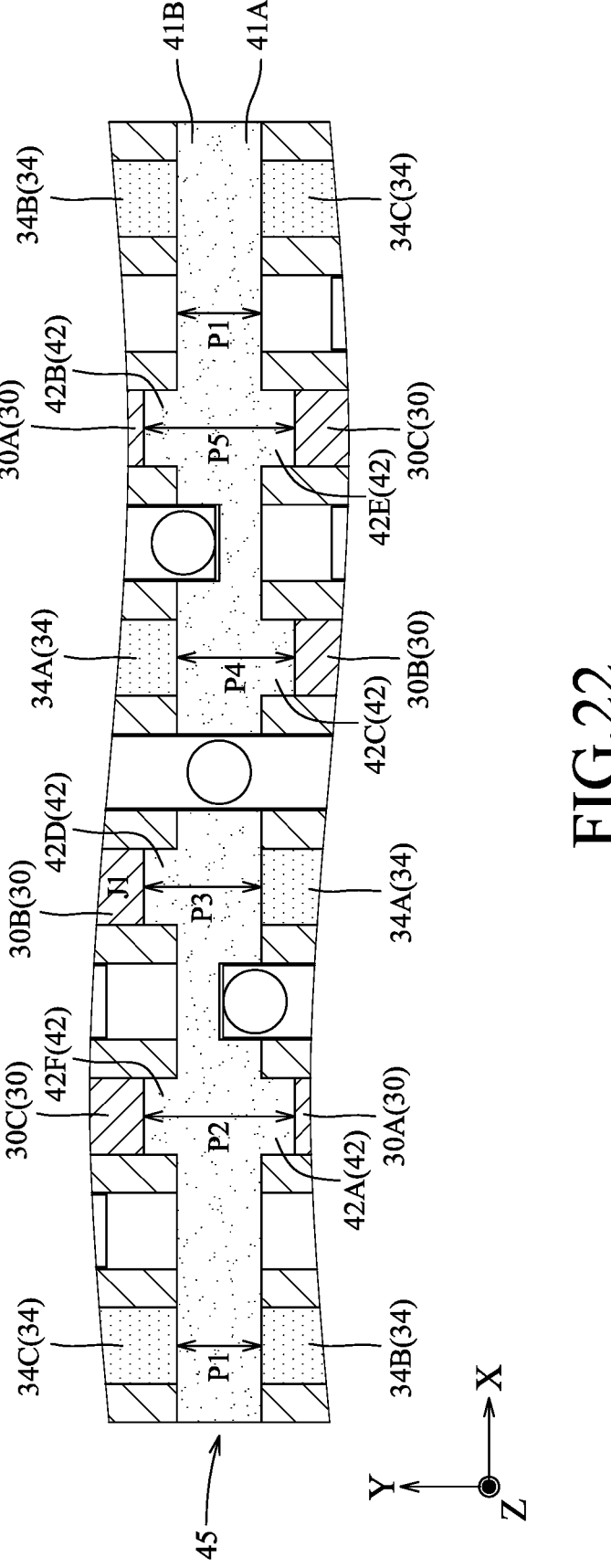
FIG. 22 is a partial view of the device structure shown in FIG. 21.

FIG. 21 illustrates yet another device structure 100 (including a cell 4 and a cell 5) in accordance with some embodiments. FIG. 22 is a partial view of the device structure 100 shown in FIG. 21. FIGS. 23, 24, 25 and 26 are cross-sectional views taken along lines C1-C1', C2-C2', C3-C3, and C4-C4' of FIG. 21, respectively. The cell 4 and the cell 5 each has a configuration similar to that of the cell 1 shown in FIG. 1. As shown in FIGS. 21 and 22, in each of the cell 4 and the cell 5, the dielectric portions 42 are each formed between the gate structures 30A, 30B, 30C and a corresponding one of the front and rear dielectric walls 41A, 41B, and includes three gate structures 30A, 30B, 30C and three isolation walls 34A, 34B, 34C. Thus, a juncture portion 45 of the dielectric units 40 of each of the cell 4 and the cell 5 has multiple parts which are displaced from each other in the X direction and which have different lengths in the Y direction.

In some embodiments, the juncture portion 45 of the dielectric units 40 of the cell 4 and the cell 5 has the rear dielectric wall 41B and the dielectric portions 42B, 42D and 42F of the cell 4, and the front dielectric wall 41A and dielectric portions 42A, 42C, and 42E of the cell 5 that are formed integrally. In some embodiments, a length Y1 of each of the dielectric portions 42 of the cell 4 and the cell 5 in the Y direction ranges from about 3 nanometers to about 20 nanometers. The length P1 of the juncture portion 45 in the Y direction (i.e., the sum of the thickness of the rear dielectric wall 41B of the cell 4 and the front dielectric wall 41A of the cell 5) ranges from about 10 nanometers to about 40 nanometers.

Figure 23:
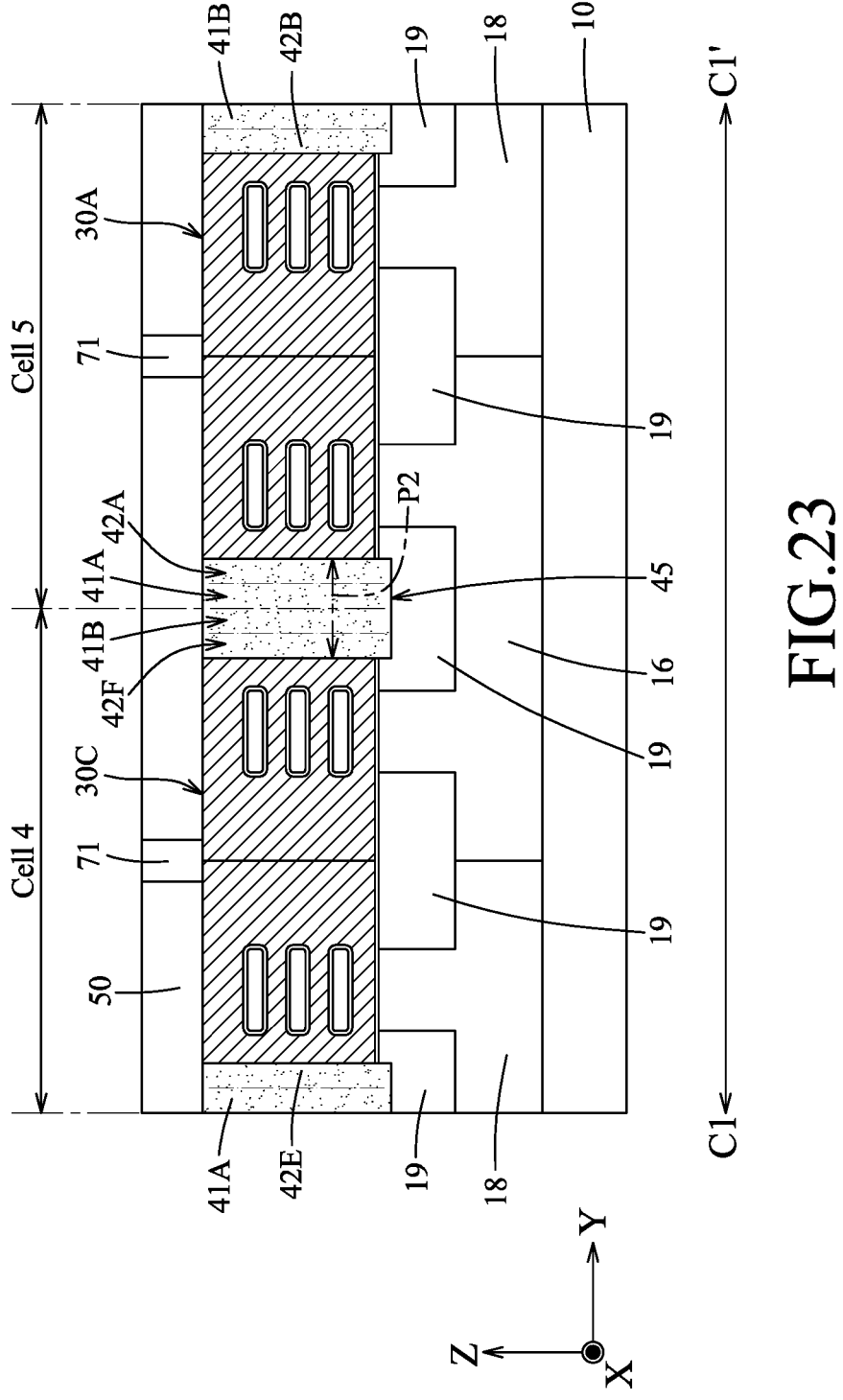
FIGS. 23, 24, 25 and 26 are cross-sectional views taken along lines C1-C1', C2-C2', C3-C3, and C4-C4' of FIG. 21, respectively.
Figure 24:
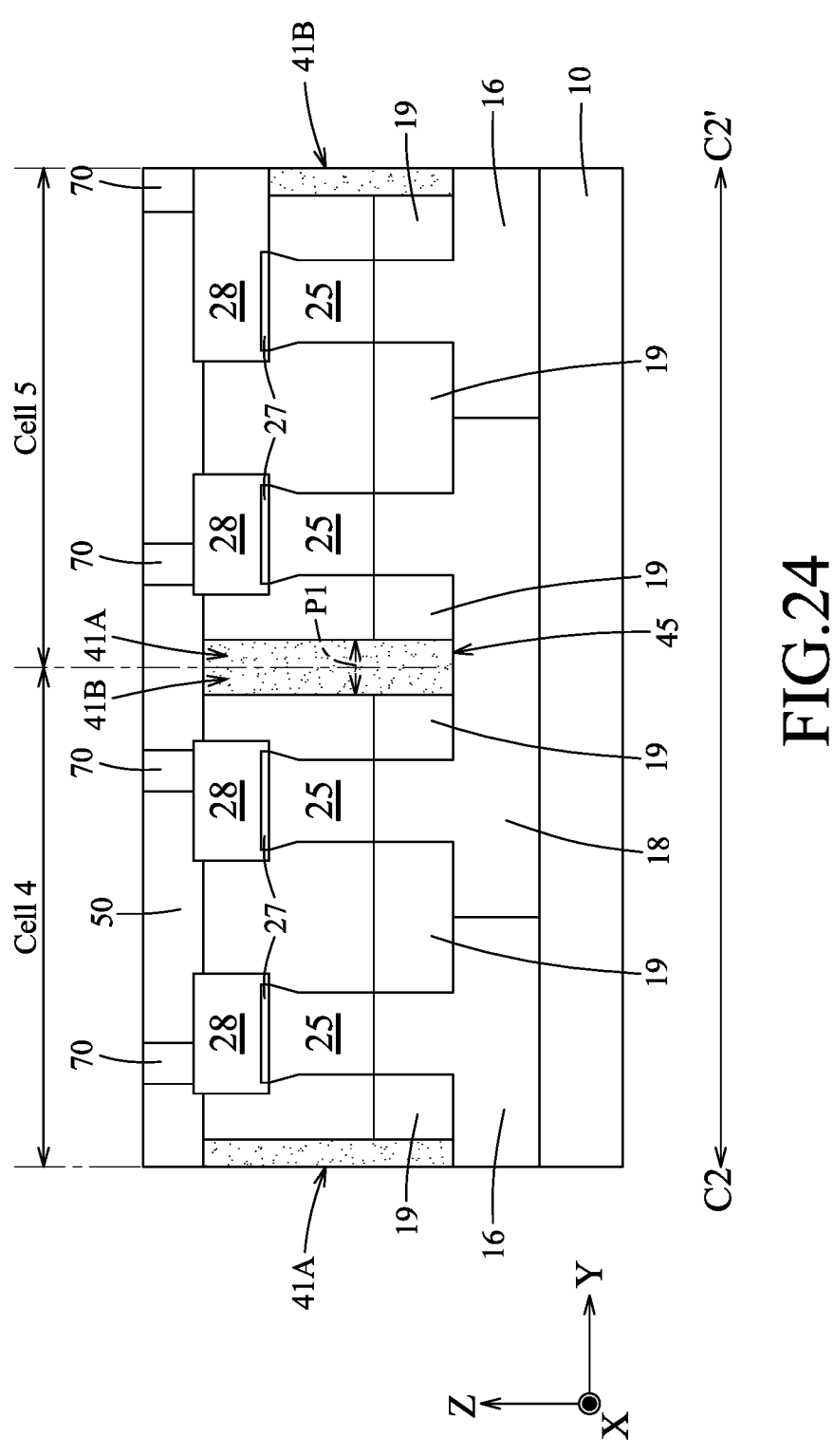
Figure 25:
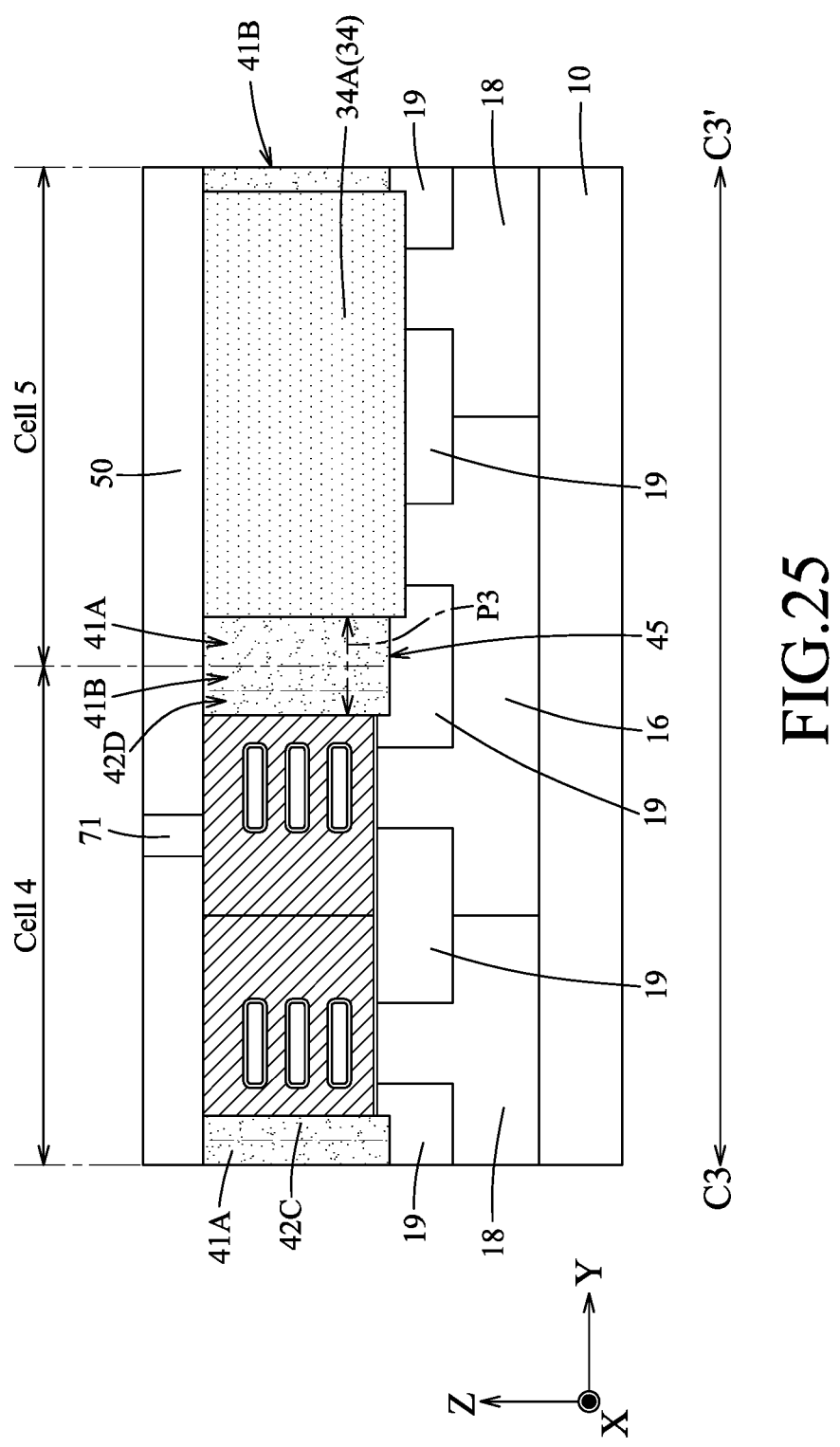
Figure 26:
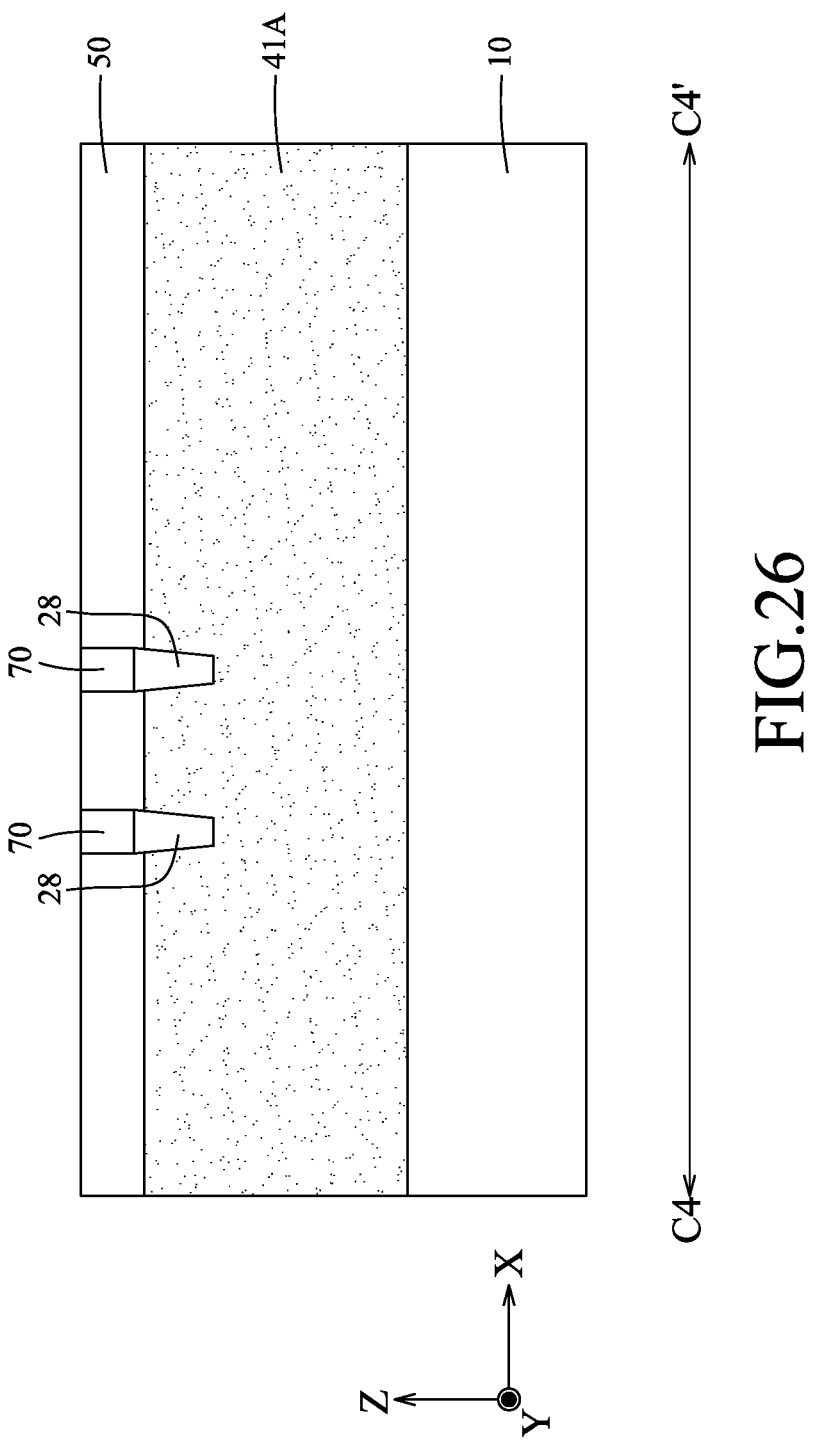

Further referring to FIG. 23, the length P2 of the juncture portion 45 in the Y direction (i.e., the sum of the thickness of the rear dielectric wall 41B of the cell 4 and the front dielectric wall 41A of the cell 5, the length of the dielectric portion 42F of the cell 4, and the length of the dielectric portion 42A of the cell 5) ranges from about 16 nanometers to about 80 nanometers. Further referring to FIG. 25, the length P3 of the juncture portion 45 in the Y direction (i.e., the sum of the thickness of the rear dielectric wall 41B of the cell 4 and the front dielectric wall 41A of the cell 5, and the length of the dielectric portion 42D of the cell 4) ranges from about 13 nanometers to about 60 nanometers. The length P4 of the juncture portion 45 in the Y direction (i.e., the sum of the thickness of the rear dielectric wall 41B of the cell 4 and the front dielectric wall 41A of the cell 5, and the length of the dielectric portion 42C of the cell 5) ranges from about 13 nanometers to about 60 nanometers. The length P5 of the juncture portion 45 in the Y direction (i.e., the sum of the thickness of the rear dielectric wall 41B of the cell 4 and the front dielectric wall 41A of the cell 5, the length of the dielectric portion 42B of the cell 4, and the length of the dielectric portion 42E of the cell 5) ranges from about 16 nanometers to about 80 nanometers.

Figure 27:
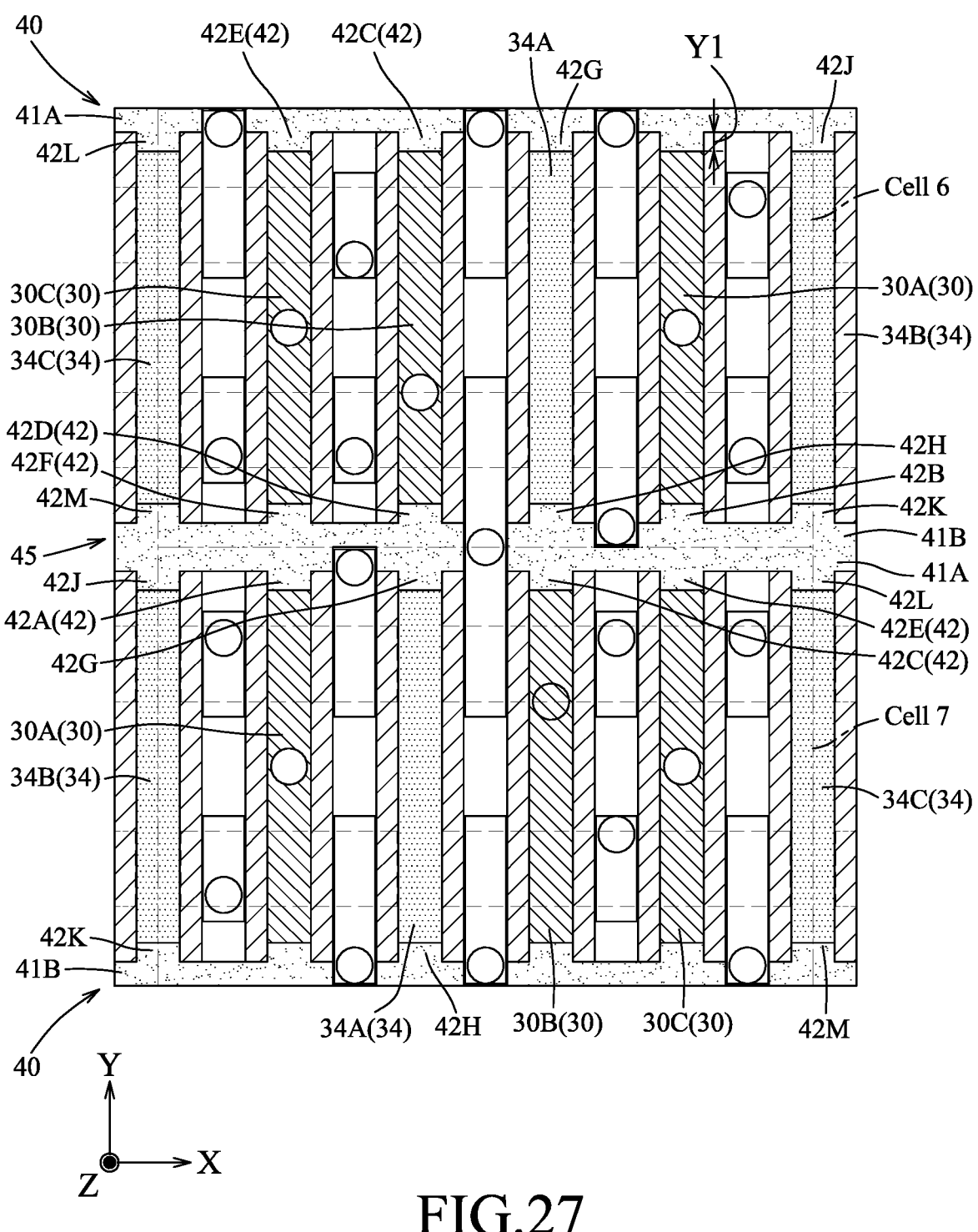
FIG. 27 illustrates yet another device structure in accordance with some embodiments.
Figure 28:
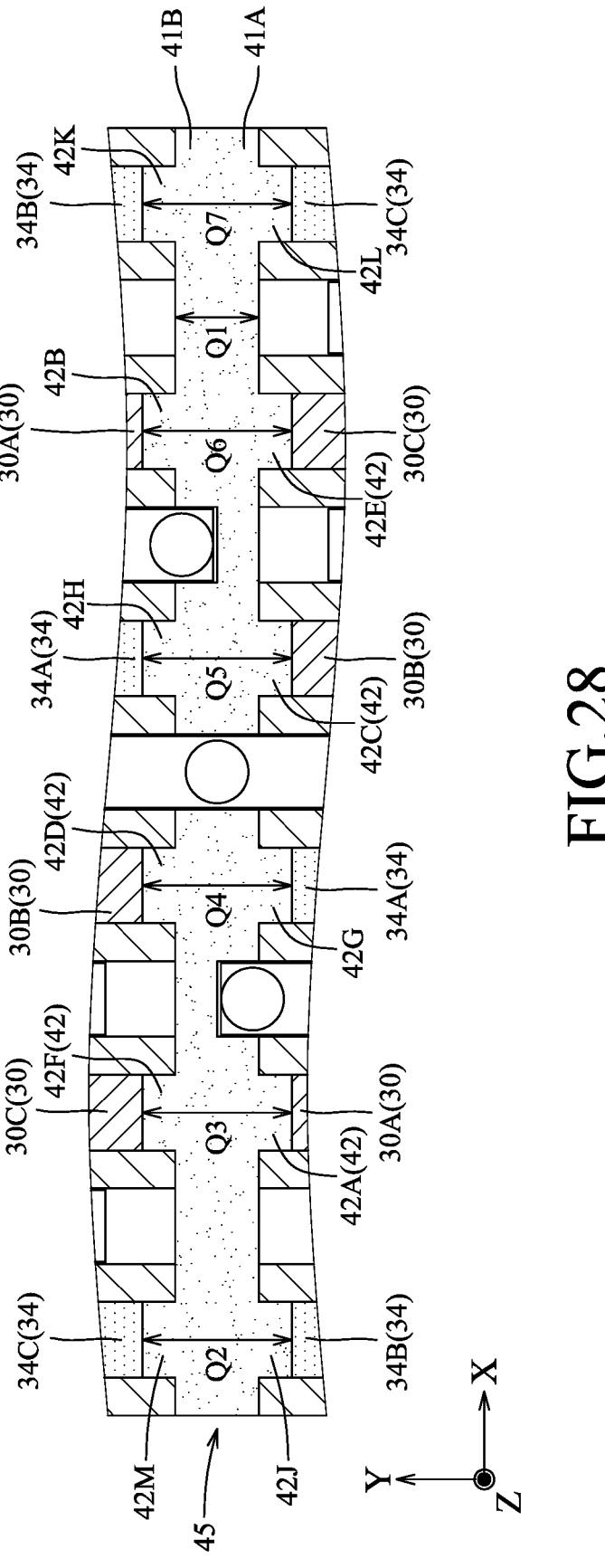
FIG. 28 is a partial view of the device structure shown in FIG. 27.

FIG. 27 illustrates yet another device structure 100 (including a cell 6 and a cell 7) in accordance with some embodiments. FIG. 28 is a partial view of the device structure 100 of FIG. 27. The cell 6 and the cell 7 each has a configuration similar to that of the cell 4 and 5 shown in FIG. 21, respectively, except that for each of the cell 6 and the cell 7, the dielectric portions 42G, 42H, 42J, 42K, 42L and 42M are formed. Thus, the resulting juncture portion 45 of the dielectric units 40 of the cell 6 and the cell 7 has multiple parts which are displaced from each other in the X direction and which have different lengths in the Y direction.

In some embodiments, the juncture portion 45 of the dielectric units 40 of the cell 6 and the cell 7 has the rear dielectric wall 41B and the dielectric portions 42B, 42D, 42F, 42H, 42K and 42M of the cell 6, and the front dielectric wall 41A and the dielectric portions 42A, 42C, 42E, 42G, 42J and 42L of the cell 7 that are formed integrally. In some embodiments, a length Y1 of each of the dielectric portions 42 of the cell 6 and the cell 7 in the Y direction ranges from about 3 nanometers to about 20 nanometers.

The length Q1 of the juncture portion 45 in the Y direction (i.e., the sum of the thickness of the rear dielectric wall 41B of the cell 6 and the front dielectric wall 41A of the cell 7) ranges from about 10 nanometers to about 40 nanometers. The length Q2 of the juncture portion 45 in the Y direction (i.e., the sum of the thickness of the rear dielectric wall 41B of the cell 6 and the front dielectric wall 41A of the cell 7, the length of the dielectric portion 42M of the cell 6, and the length of the dielectric portion 42J of the cell 7) ranges from about 16 nanometers to about 80 nanometers, or alternatively ranges from about 14 nanometers to about 60 nanometers. The length Q3 of the juncture portion 45 in the Y direction (i.e., the sum of the thickness of the rear dielectric wall 41B of the cell 6 and the front dielectric wall 41A of the cell 7, the length of the dielectric portion 42F of the cell 6, and the length of the dielectric portion 42A of the cell 7) ranges from about 16 nanometers to about 80 nanometers. The length Q4 of the juncture portion 45 in the Y direction (i.e., the sum of the thickness of the rear dielectric wall 41B of the cell 6 and the front dielectric wall 41A of the cell 7, the length of the dielectric portion 42D of the cell 6, and the length of the dielectric portion 42G of the cell 7) ranges from about 16 nanometers to about 80 nanometers, or alternatively ranges from about 15 nanometers to about 70 nanometers. The length Q5 of the juncture portion 45 in the Y direction (i.e., the sum of the thickness of the rear dielectric wall 41B of the cell 6 and the front dielectric wall 41A of the cell 7, the length of the dielectric portion 42H of the cell 6, and the length of the dielectric portion 42C of the cell 5) ranges from about 16 nanometers to about 80 nanometers, or alternatively ranges from about 15 nanometers to about 70 nanometers. The length Q6 of the juncture portion 45 in the Y direction (i.e., the sum of the thickness of the rear dielectric wall 41B of the cell 6 and the front dielectric wall 41A of the cell 7, the length of the dielectric portion 42B of the cell 6, and the length of the dielectric portion 42E of the cell 7) ranges from about 16 nanometers to about 80 nanometers. The length Q7 of the juncture portion 45 in the Y direction (i.e., the sum of the thickness of the rear dielectric wall 41B of the cell 6 and the front dielectric wall 41A of the cell 7, the length of the dielectric portion 42K of the cell 6, and the length of the dielectric portion 42L of the cell 7) ranges from about 16 nanometers to about 80 nanometers, or alternatively ranges from about 14 nanometers to about 60 nanometers. In some embodiments, each of the lengths Q2, Q5 and Q7 is substantially the same as each of the lengths Q3, Q4 and Q6. In some other embodiments, each of the lengths Q2, Q5 and Q7 is smaller than each of the lengths Q3, Q4 and Q6.

Figure 29:
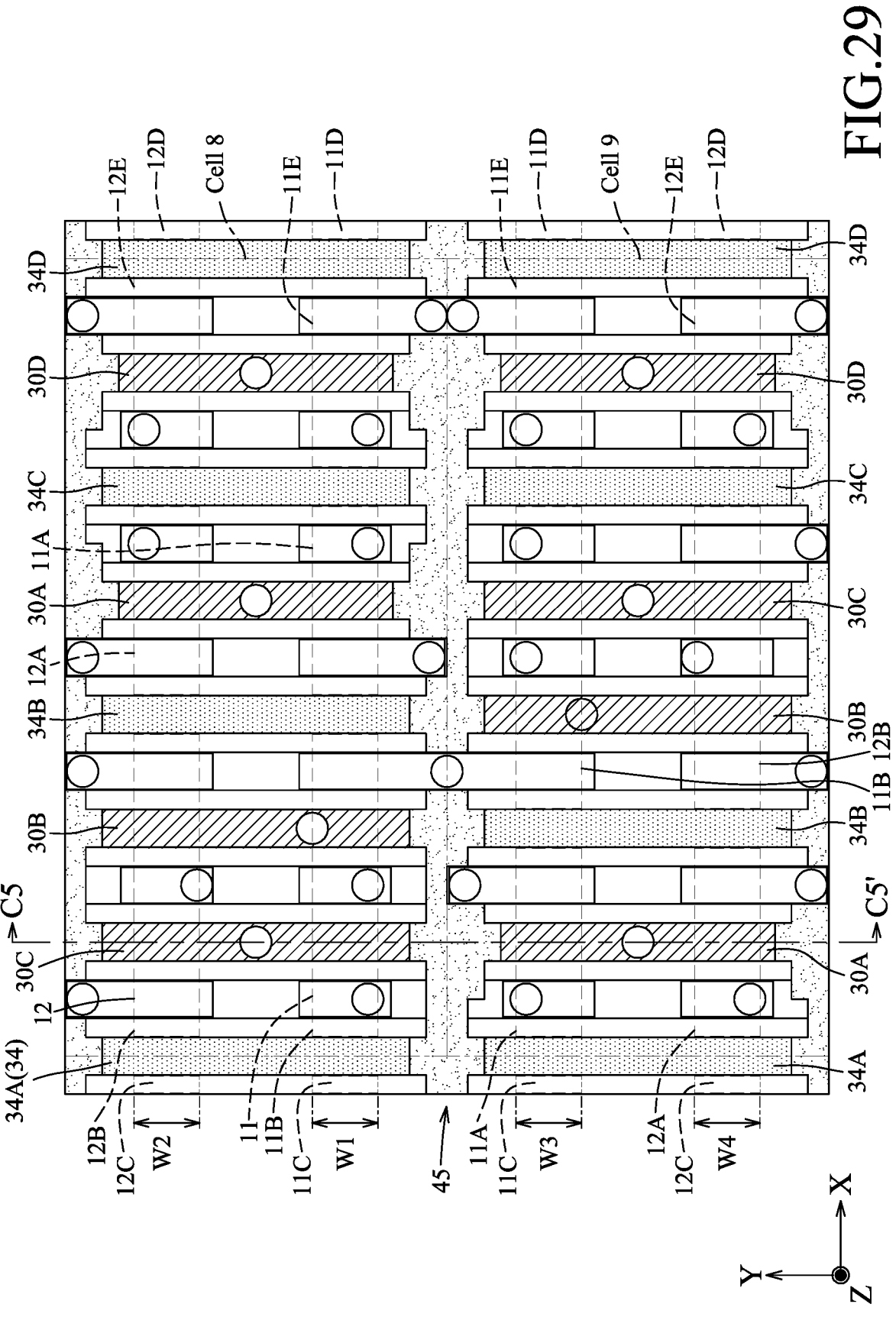
FIG. 29 illustrates yet another device structure in accordance with some embodiments.
Figures 30, 31, 32:
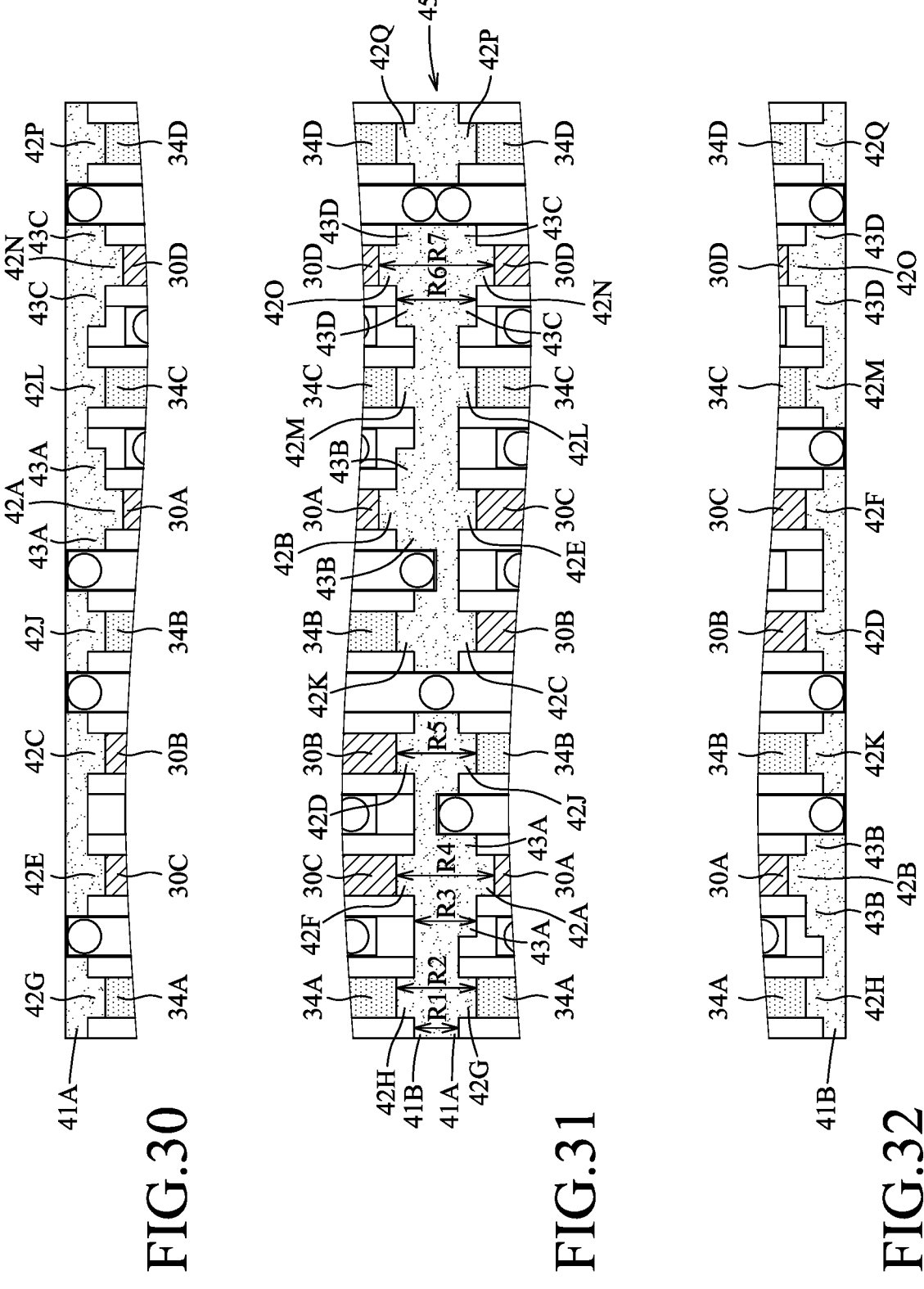
FIGS. 30 to 32 are respectively three different partial views of the device structure shown in FIG. 29.
Figure 33:
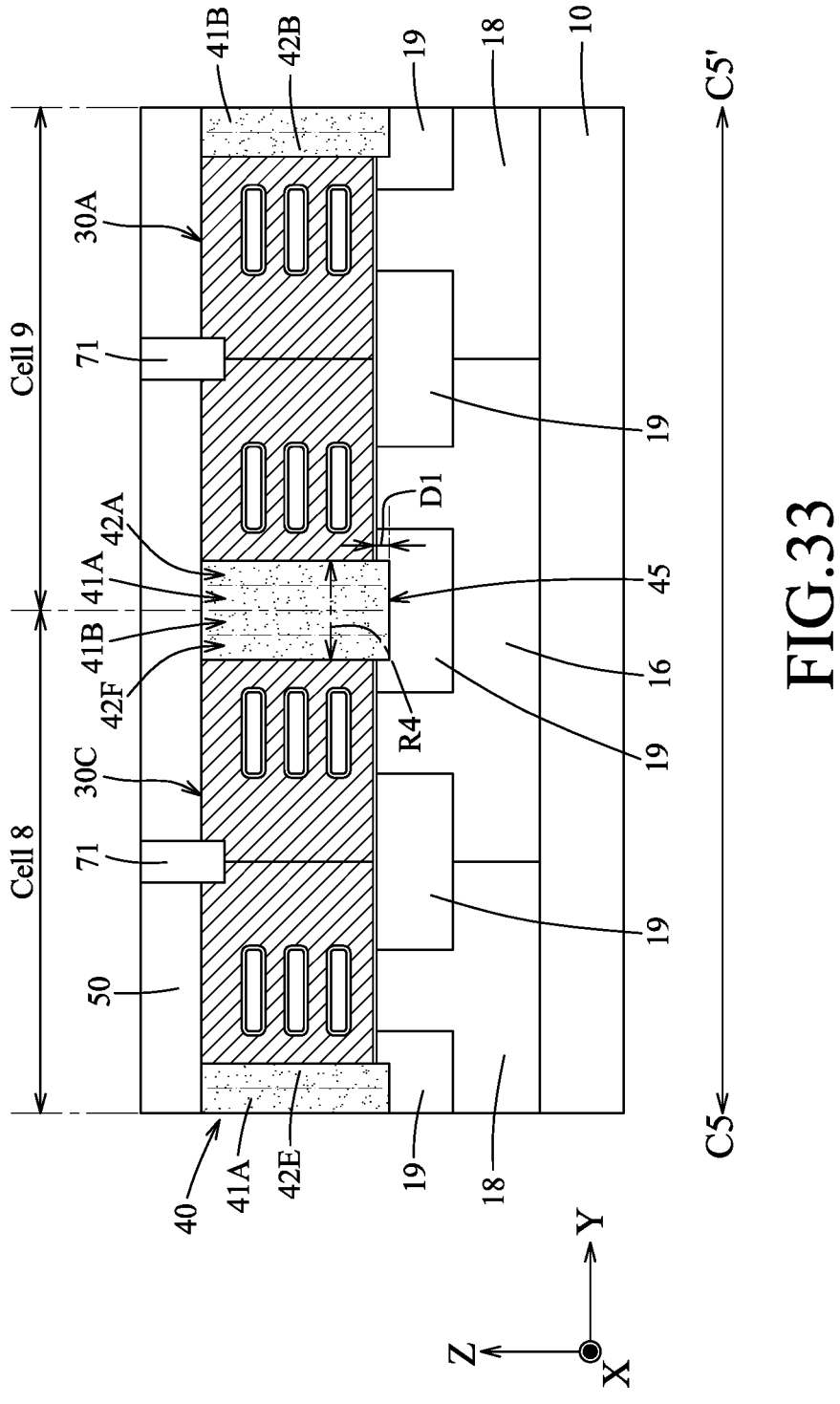
FIG. 33 is a cross-sectional view taken along lines C5-C5' of FIG. 29.

FIG. 29 illustrates yet another device structure 100 (including a cell 8 and a cell 9) in accordance with some embodiments. FIG. 30 is a partial view of the cell 8 of FIG. 29. FIG. 31 is a partial view of a juncture portion 45 of the dielectric units 40 of the cell 8 and the cell 9. FIG. 32 is a partial view of the cell 9 of FIG. 29. FIG. 33 is a cross-sectional view taken along lines C5-C5' of FIG. 29. The cell 8 and the cell 9 each has a configuration similar to that of the cell 2 shown in FIG. 18, respectively, except that for each of the cell 8 and the cell 9, four gate structures 30A, 30B, 30C and 30D and four isolation walls 34 A, 34B, 34C and 34D are included. The isolation walls 34A and 34D are disposed at two lateral sides of the fin structures 11 and 12 in the X direction, so as to further separate the fin structures 11 and 12 from the fin structures 11C, 11D, 12C, 12D. In addition, the fin structure 11 further includes a third fin portion 11E, and the fin structure 12 further includes a third fin portion 12E. The first fin portion 11A, the second fin portion 11B, the first fin portion 12A and the second fin portion 12B have widths W3, W1, W4, W2, respectively. The third fin portion 11E for each of the cell 8 and the cell 9 has a width that is substantially the same as the width W3 of the first fin portion 11A. The third fin portions 12E for each of the cell 8 and the cell 9 has a width that is substantially the same as the width W4 of the first fin portion 12A. Each of the widths W1 and W2 is longer than each of the widths W3 and W4. In some embodiments, a ratio of the width W1 to the width W3 ranges from about 1.2 to about 5, and a ratio of the width W2 to the width W4 ranges from about 1.2 to about 5.

The dielectric portions 42 are each formed between the gate structures 30A, 30B, 30C and 30D and a corresponding one of the front and rear dielectric walls 41A, 41B, and between the isolation walls 34A, 34B, 34C and 34D and a corresponding one of the front and rear dielectric walls 41A, 41B. In some embodiments, for each of the cell 8 and cell 9, (i) two additional dielectric portions 42N and 42O are formed on two ends of the gate structure 30D on the Y direction to connect to the front and rear dielectric walls 41A, 41B, respectively, (ii) two additional dielectric portions 42P and 42Q are formed on two ends of the isolation wall 34D on the Y direction to connect to the front and rear dielectric walls 41A, 41B, respectively, (iii) an additional pair of side blocks 43C are disposed at two lateral sides of the dielectric portion 42N, and (iv) an additional pair of side blocks 43D are disposed as two lateral sides of the dielectric portion 42O.

Thus, the juncture portion 45 of the dielectric units 40 of the cell 8 and the cell 9 has multiple parts which are displaced from each other in the X direction and which have different lengths in the Y direction.

The length R1 of the juncture portion 45 in the Y direction (i.e., the sum of the thickness of the rear dielectric wall 41B of the cell 8 and the front dielectric wall 41A of the cell 9) ranges from about 10 nanometers to about 40 nanometers. The length R2 of the juncture portion 45 in the Y direction (i.e., the sum of the thickness of the rear dielectric wall 41B of the cell 8, the front dielectric wall 41A of the cell 9, the length of the dielectric portion 42H of the cell 8, and the length of the dielectric portion 42G of the cell 9) ranges from about 16 nanometers to about 80 nanometers, or alternatively ranges from about 14 nanometers to about 60 nanometers. The length R3 of the juncture portion 45 in the Y direction (i.e., the sum of the thickness of the rear dielectric wall 41B of the cell 8, the front dielectric wall 41A of the cell 9, and the length of the side block 43A of the cell 9) ranges from about 13 nanometers to about 60 nanometers. The length R4 of the juncture portion 45 in the Y direction (i.e., the sum of the thickness of the rear dielectric wall 41B of the cell 8, the front dielectric wall 41A of the cell 9, the length of the dielectric portions 42F of the cell 8, and the length of the dielectric portions 42A of the cell 9) ranges from about 19 nanometers to about 100 nanometers. The length R5 of the juncture portion 45 in the Y direction (i.e., the sum of the thickness of the rear dielectric wall 41B of the cell 8, the front dielectric wall 41A of the cell 9, the length of the dielectric portion 42D of the cell 8, and the length of the dielectric portions 42J cell 9) ranges from about 16 nanometers to about 80 nanometers, or alternatively ranges from about 15 nanometers to about 70 nanometers. The length R6 of the juncture portion 45 in the Y direction (i.e., the sum of the thickness of the rear dielectric wall 41B of the cell 8, the front dielectric wall 41A of the cell 9, the length of the side block 43D of the cell 8, and the length of the side block 43C of the cell 9) ranges from about 16 nanometers to about 80 nanometers. The length R7 of the juncture portion 45 in the Y direction (i.e., the sum of the thickness of the rear dielectric wall 41B of the cell 8, the front dielectric wall 41A of the cell 9, the length of the dielectric portions 42O of the cell 8, and the length of the dielectric portions 42N of the cell 9) ranges from about 22 nanometers to about 120 nanometers. Generally, the length R7 is larger than the length R4, and the length R4 is larger than the length R2. Additionally, the length R6 is larger than the length R3, and the length R3 is larger than the length R1. Referring to FIG. 33, in some embodiments, the dielectric unit 40 has a depth (D1) reaching into the corresponding STI and ranging from about 3 nanometers to about 50 nanometers.

Figure 34:
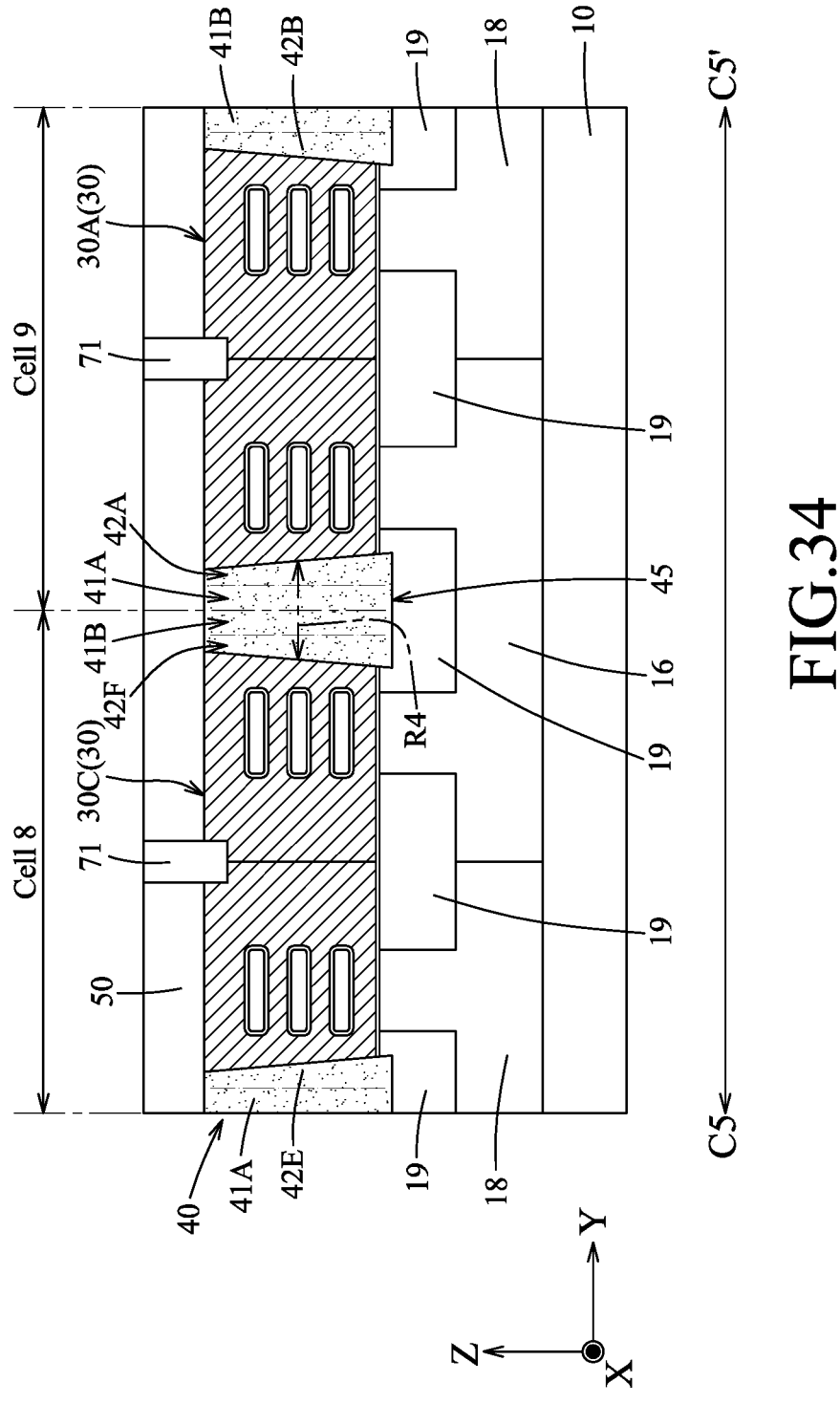
FIGS. 34 and 35 are cross-sectional views respectively taken along line C5-C5' of FIG. 29 in accordance with some alternative embodiments
Figure 35:
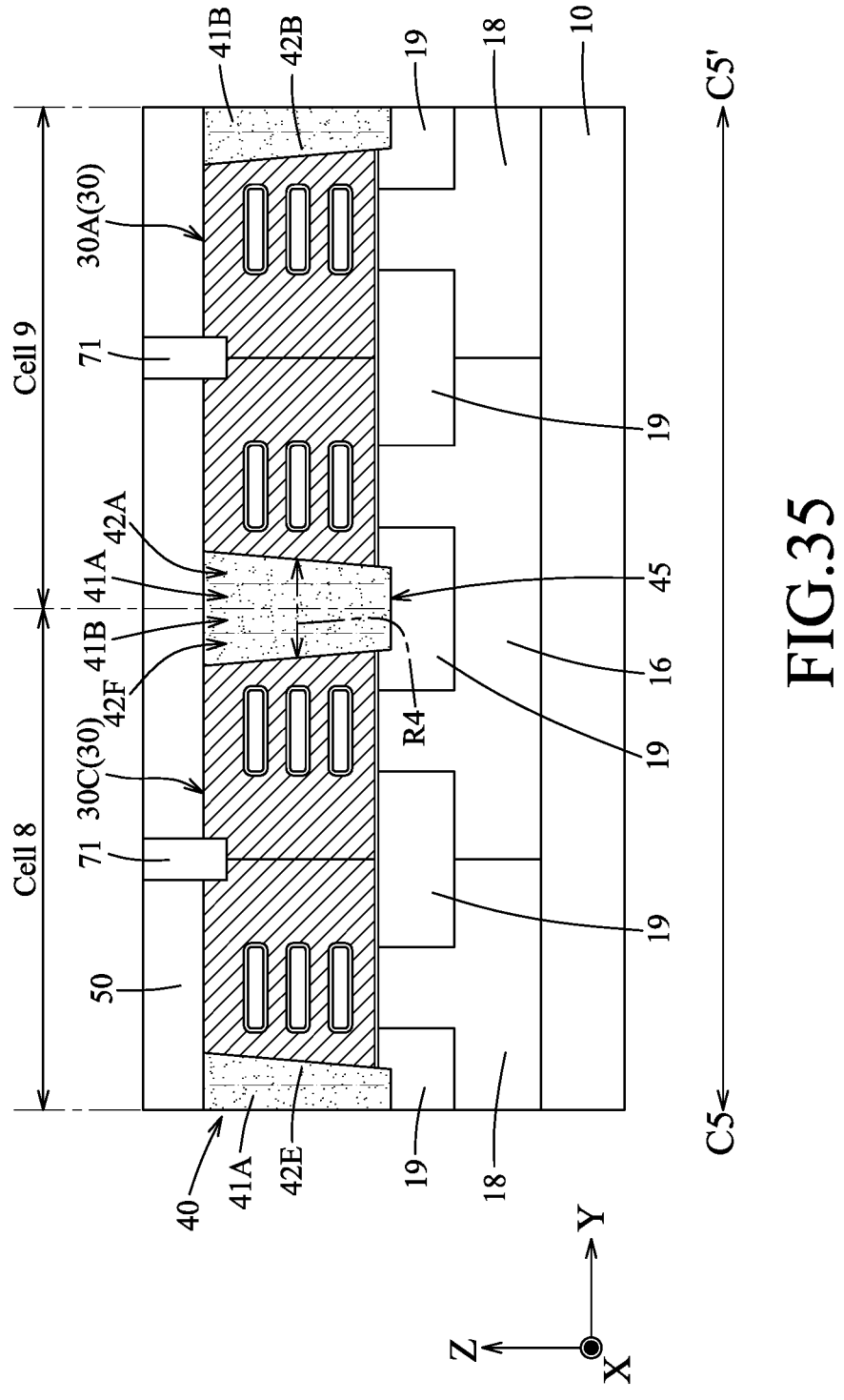

FIGS. 34 and 35 are cross-sectional views respectively taken along line C5-C5' of FIG. 29 in accordance with some alternative embodiments. Further referring to FIG. 10, in step 410, the selective etching operation performed downwardly in the Z direction may not result in a "straight" line along the Z direction. That is to say, a junction of the gate structure 30 and the dielectric unit 40 in the Z direction may be substantially a slash line. As such, the length R4 of the juncture portion 45 in the Y direction may not be uniform along the Z direction. In some embodiments, as shown in FIG. 34, the length of the juncture portion 45 in the Y direction (e.g., the length R4) gradually increases along the Z direction toward the substrate 10. In some embodiments, as shown in FIG. 35, the length of the juncture portion 45 in the Y direction (e.g., the length R4) gradually decreases along the Z direction toward the substrate 10.

Figure 36:
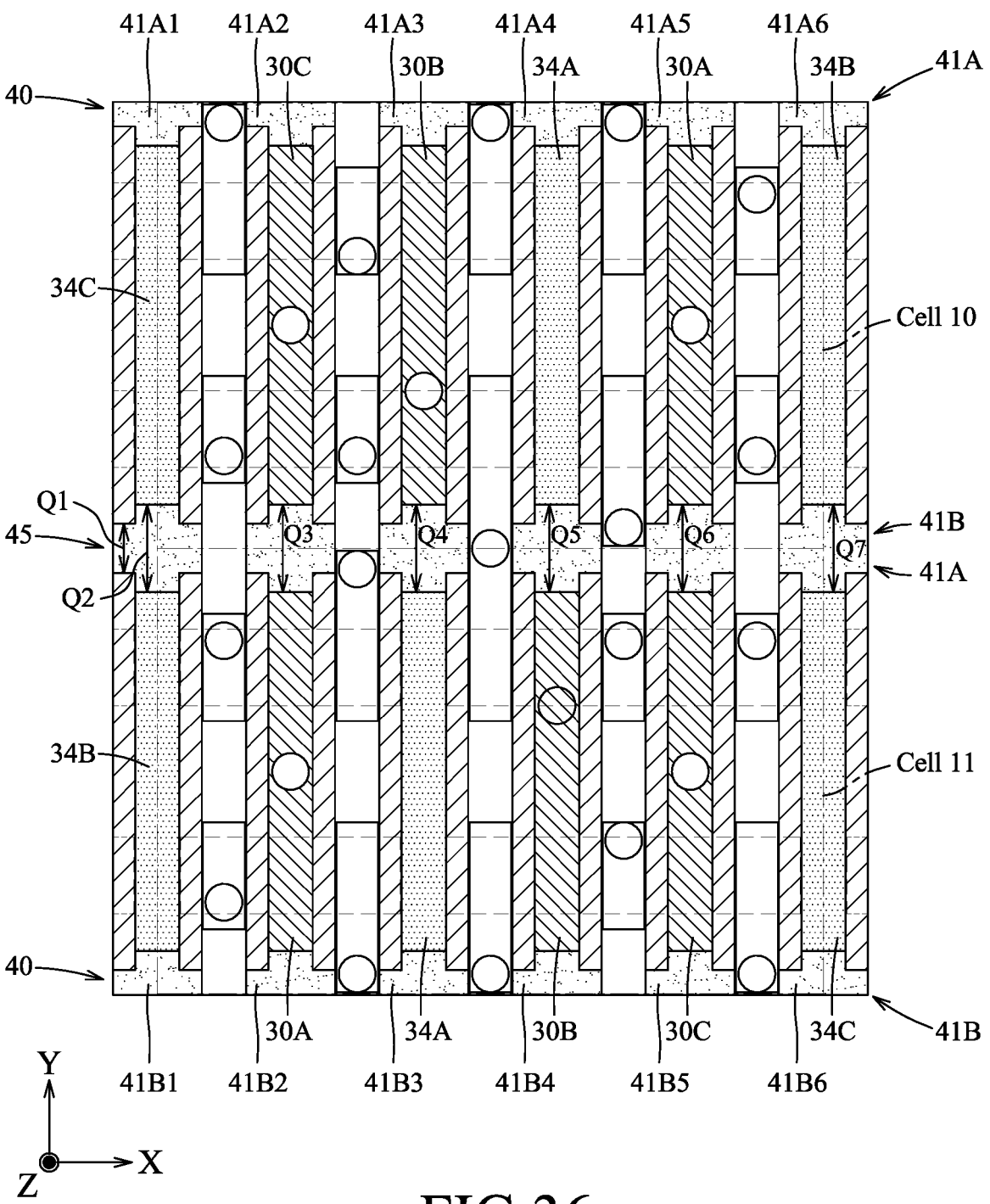
FIG. 36 illustrates yet another device structure in accordance with some embodiments.

FIG. 36 illustrates yet another device structure 100 (including a cell 10 and a cell 11) in accordance with some embodiments. The cell 10 and the cell 11 each has a configuration similar to that of the cell 6 and cell 7 shown in FIG. 27, respectively, except that the front dielectric wall 41A of each of the cell 10 and the cell 11 is in the form of a plurality of front wall segments 41A1, 41A2, 41A3, 41A4, 41A5 and 41A6, and the rear dielectric wall 41B of each of the cell 10 and the cell 11 is in the form of a plurality of rear wall segments 41B1, 41B2, 41B3, 41B4, 41B5 and 41B6. The juncture portion 45 of the dielectric units 40 of the cell 10 and the cell 11 has multiple parts which are displaced from each other in the X direction and which have different lengths in the Y direction.

As shown in FIG. 36, each of the lengths Q1 to Q7 labeled on the juncture portion 45 of the cell 10 and the cell 11 may be in a range that is about the same to the lengths Q1 to Q7 labeled on the cell 6 and the cell 7 shown in FIG. 28.

In the various embodiment of the disclosure, a device structure is provided to "shrink" the size of the gate structures. In other words, each of the gate structures may have a gate-end portion that is located on the dielectric structure 19 (e.g., STI) and that has a relatively smaller length. This configuration may assist in reducing the related parasitical capacitances, for examples, the parasitical capacitances induced by (i) the gate-end portions of two adjacent ones of the gate structures, (ii) the gate end portion and the STI, (iii) the gate end portion and the source/drain contacts, and other adjacent layers-induced parasitic capacitance. Additionally, control of a related critical dimension uniformity (CDU) may be improved by reducing the length of the gate structures.

In accordance with some embodiments of the present disclosure, a device structure includes a substrate, a fin structure, a gate structure, at least one dielectric portion, and a pair of gate spacers. The fin structure is disposed on the substrate and elongated in an X direction. The gate structure is formed on the fin structure and is elongated in a Y direction transverse to the X direction to terminate at two opposite ends. The at least one dielectric portion is connected to at least one of the two opposite ends of the gate structure, and has two sides that are opposite to each other in the X direction. The pair of gate spacers are spaced apart from each other in the X direction and are respectively disposed on two lateral sides of the gate structure, and are elongated in the Y direction to cover the two sides of the at least one dielectric portion, respectively.

In accordance with some embodiments of the present disclosure, the at least one dielectric portion includes two dielectric portions which are connected to the two opposite ends of the gate structure, respectively. The pair of gate spacers are disposed to cover the two sides of each of the two dielectric portions, respectively.

In accordance with some embodiments of the present disclosure, a length of the at least one dielectric portion along the Y direction ranges from 3 nanometers to 20 nanometers.

In accordance with some embodiments of the present disclosure, the at least one dielectric portion is made of a material different from that of the pair of gate spacers.

In accordance with some embodiments of the present disclosure, the fin structure includes two source/drain features disposed at two opposite sides of the gate structure, and a plurality of channel layers surrounded by the gate structure. A minimum distance between the at least one dielectric portion and each of the channel layers ranges from 3 nanometers to 20 nanometers.

In accordance with some embodiments of the present disclosure, another device structure includes a substrate, a fin structure, a first gate structure, a second gate structure, a front dielectric wall, a first front protrusion, a second front protrusion, a rear dielectric wall, a first rear protrusion, and a second rear protrusion. The fin structure is disposed on the substrate and elongated in an X direction. The first gate structure is formed on the fin structure and is elongated in a Y direction transverse to the X direction to terminate at a first front end and a first rear end. The second gate structure is formed on the fin structure and is elongated in the Y direction to terminate at a second front end and a second rear end. The second gate structure is spaced apart from the first gate structure in the X direction. The front dielectric wall is formed at a front side of each of the first gate structure and the second gate structure, and is elongated in the X direction. The first front protrusion is connected between the front dielectric wall and the first front end of the first gate structure. The second front protrusion is connected between the front dielectric wall and the second front end of the second gate structure. The rear dielectric wall is formed at a rear side of each of the first gate structure and the second gate structure, and is elongated in the X direction. The first rear protrusion is connected between the rear dielectric wall and the first rear end of the first gate structure. The second rear protrusion is connected between the rear dielectric wall and the second rear end of the second gate structure.

In accordance with some embodiments of the present disclosure, the fin structure includes a first fin portion and a second fin portion which are displaced from each other in the X direction, and which have different widths in the Y direction. The first gate structure is formed on the first fin portion, and the second gate structure is formed on the second fin portion. The first front protrusion and the second front protrusion have different lengths in the Y direction. The first rear protrusion and the second rear protrusion have different lengths in the Y direction.

In accordance with some embodiments of the present disclosure, the device structure further includes an isolation wall which separates the first fin portion from the second fin portion, and which is elongated in the Y direction to terminate at a front wall end facing the front dielectric wall and a rear wall end facing the rear dielectric wall.

In accordance with some embodiments of the present disclosure, the front wall end of the isolation wall is connected to the front dielectric wall, and the rear wall end of the isolation wall is connected to the rear dielectric wall so that the isolation wall has a length in the Y direction which is greater than that of each of the first gate structure and the second gate structure.

In accordance with some embodiments of the present disclosure, the device structure further includes a front dielectric jog disposed between the front wall end of the isolation wall and the front dielectric wall, and a rear dielectric jog disposed between the rear wall end of the isolation wall and the rear dielectric wall.

In accordance with some embodiments of the present disclosure, the device structure further includes a pair of isolation spacers which are spaced apart from each other in the X direction and are respectively disposed on two lateral sides of the isolation wall, and which are elongated in the Y direction to cover two sides of each of the front dielectric jog and the rear dielectric jog, respectively.

In accordance with some embodiments of the present disclosure, the fin structure includes a first fin portion and a second fin portion which are displaced from each other in the X direction. The first fin portion has a width less than that of the second fin portion in the Y direction. The first gate structure is formed on the first fin portion, and the second gate structure is formed on the second fin portion. The first front protrusion has a length greater than that of the second front protrusion in the Y direction. The first rear protrusion has a length greater than that of the second rear protrusion in the Y direction.

In accordance with some embodiments of the present disclosure, a ratio of the width of the second fin portion to a width of the first fin portion in the Y direction ranges from 1.2 to 5.

In accordance with some embodiments of the present disclosure, the device structure further includes a pair of first gate spacers and a pair of second gate spacers. The pair of first gate spacers are spaced apart from each other in the X direction and are respectively disposed on two lateral sides of the first gate structure, and are elongated in the Y direction to cover two sides of each of the first front protrusion and the first rear protrusion, respectively. The pair of second gate spacers are spaced apart from each other in the X direction and are respectively disposed on two lateral sides of the second gate structure, and are elongated in the Y direction to cover two sides of each of the second front protrusion and the second rear protrusion, respectively.

In accordance with some embodiments of the present disclosure, each of the first gate spacers has a length in the Y direction less than that of each of the second gate spacers.

In accordance with some embodiments of the present disclosure, the device structure further includes a pair of front side blocks and a pair of rear side blocks. The pair of front side blocks are connected to and disposed at two opposite sides of the first front protrusion, respectively. Each of the front side blocks connects the front dielectric wall to a corresponding one of the first gate spacers. The pair of rear side blocks are connected to and disposed at two opposite sides of the first rear protrusion, respectively. Each of the rear side blocks connects the rear dielectric wall to a corresponding one of the first gate spacers.

In accordance with some embodiments of the present disclosure, each of the first fin portion and the second fin portion includes two source/drain features respectively disposed at two opposite sides of a corresponding one of the first gate structure and the second gate structure, and a channel portion covered by the corresponding one of the first gate structure and the second gate structure.

In accordance with some embodiments of the present disclosure, each of the first gate structure and the second gate structure includes a gate electrode and a gate dielectric layer disposed to separate the gate electrode from the channel portion.

In accordance with some embodiments of the present disclosure, the channel portion includes a plurality of channel layers which are surrounded by the corresponding one of the first gate structure and the second gate structure.

In accordance with some embodiments of the present disclosure, a method for manufacturing a device structure includes: forming a fin substrate on a substrate, the fin structure being elongated in an X direction; forming a gate structure on the fin structure, the gate structure being elongated in a Y direction transverse to the X direction to terminate at two opposite ends; forming at least one dielectric portion which is connected to at least one of the two opposite ends of the gate structure, and which has two sides that are opposite to each other in the X direction; and forming a pair of gate spacers which are spaced apart from each other in the X direction and are respectively disposed on two lateral sides of the gate structure, and which are elongated in the Y direction to cover the two sides of the at least one dielectric portion, respectively.

In accordance with some embodiments of the present disclosure, the at least one dielectric portion is formed after forming the gate structure and the pair of the gate spacers.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device structure comprising:
a substrate;
a fin structure disposed on the substrate and elongated in an X direction;
a gate structure formed on the fin structure and elongated in a Y direction transverse to the X direction to terminate at two opposite ends;

at least one dielectric portion connected to at least one of the two opposite ends of the gate structure, and having two sides that are opposite to each other in the X direction; and
gate spacers spaced apart from each other in the X direction and respectively disposed on two lateral sides of the gate structure, the gate spacers being elongated in the Y direction to cover the two sides of the at least one dielectric portion, respectively;
wherein:
the at least one dielectric portion includes two dielectric portions which are connected to the two opposite ends of the gate structure, respectively; and
the gate spacers are disposed to cover the two sides of at least one of the two dielectric portions, respectively.

2. The device structure as claimed in claim 1, wherein a length of at least one of the two dielectric portions along the Y direction ranges from 3 nanometers to 20 nanometers.

3. The device structure as claimed in claim 1, wherein at least one of the two dielectric portions is made of a material different from a material of the gate spacers.

4. The device structure as claimed in claim 1, wherein:
the fin structure includes two source/drain features respectively disposed at two opposite sides of the gate structure, and a plurality of channel layers surrounded by the gate structure; and
a minimum distance between one of the two dielectric portions and each of the channel layers ranges from 3 nanometers to 20 nanometers.

5. A device structure comprising:
a substrate;
a fin structure disposed on the substrate and elongated in an X direction;
a first gate structure formed on the fin structure and elongated in a Y direction transverse to the X direction to terminate at a first front end and a first rear end;
a second gate structure formed on the fin structure and elongated in the Y direction to terminate at a second front end and a second rear end, the second gate structure being spaced apart from the first gate structure in the X direction;
a front dielectric wall formed at a front side of each of the first gate structure and the second gate structure, and elongated in the X direction;
a first front protrusion connected between the front dielectric wall and the first front end of the first gate structure;
a second front protrusion connected between the front dielectric wall and the second front end of the second gate structure;
a rear dielectric wall formed at a rear side of each of the first gate structure and the second gate structure, and elongated in the X direction;
a first rear protrusion connected between the rear dielectric wall and the first rear end of the first gate structure; and
a second rear protrusion connected between the rear dielectric wall and the second rear end of the second gate structure.

6. The device structure as claimed in claim 5, wherein:
the fin structure includes a first fin portion and a second fin portion which are displaced from each other in the X direction, and which have different widths in the Y direction;
the first gate structure is formed on the first fin portion, and the second gate structure is formed on the second fin portion;

the first front protrusion and the second front protrusion have different lengths in the Y direction; and the first rear protrusion and the second rear protrusion have different lengths in the Y direction.

7. The device structure as claimed in claim 6, wherein each of the first fin portion and the second fin portion includes:

two source/drain features respectively disposed at two opposite sides of a corresponding one of the first gate structure and the second gate structure; and a channel portion covered by the corresponding one of the first gate structure and the second gate structure.

8. The device structure as claimed in claim 7, wherein the channel portion includes a plurality of channel layers which are surrounded by the corresponding one of the first gate structure and the second gate structure.

9. The device structure as claimed in claim 7, wherein the channel portion includes channel layers which are spaced apart from each other in a Z direction different from the X direction and the Y direction.

10. The device structure as claimed in claim 5, further comprising an isolation wall which separates the first fin portion from the second fin portion, and which is elongated in the Y direction to terminate at a front wall end facing the front dielectric wall and a rear wall end facing the rear dielectric wall.

11. The device structure as claimed in claim 10, wherein the front wall end of the isolation wall is connected to the front dielectric wall, and the rear wall end of the isolation wall is connected to the rear dielectric wall so that the isolation wall has a length in the Y direction which is greater than a length of at least one of the first gate structure and the second gate structure in the Y direction.

12. The device structure as claimed in claim 10, further comprising:

a front dielectric jog disposed between the front wall end of the isolation wall and the front dielectric wall; and a rear dielectric jog disposed between the rear wall end of the isolation wall and the rear dielectric wall.

13. The device structure as claimed in claim 12, further comprising:

a pair of isolation spacers which are spaced apart from each other in the X direction and are respectively disposed on two lateral sides of the isolation wall and which are elongated in the Y direction to cover two sides of each of the front dielectric jog and the rear dielectric jog, respectively.

14. The device structure as claimed in claim 12, wherein:

the fin structure includes a first fin portion and a second fin portion which are displaced from each other in the X direction, the first fin portion having a width in the Y direction that is less than a width of the second fin portion in the Y direction;

the first gate structure is formed on the first fin portion, and the second gate structure is formed on the second fin portion;

the first front protrusion has a length in the Y direction that is greater than a length of the second front protrusion in the Y direction; and the first rear protrusion has a length in the Y direction that is greater than a length of the second rear protrusion in the Y direction.

15. The device structure as claimed in claim 14, wherein a ratio of the width of the second fin portion to a width of the first fin portion in the Y direction ranges from 1.2 to 5.

16. The device structure as claimed in claim 14, further comprising:

two first gate spacers which are spaced apart from each other in the X direction and are respectively disposed on two lateral sides of the first gate structure, and which are elongated in the Y direction to cover two sides of each of the first front protrusion and the first rear protrusion, respectively; and two second gate spacers which are spaced apart from each other in the X direction and are respectively disposed on two lateral sides of the second gate structure, and which are elongated in the Y direction to cover two sides of each of the second front protrusion and the second rear protrusion, respectively.

17. The device structure as claimed in claim 16, wherein a length of at least one of the two first gate spacers in the Y direction is less than a length of at least one of the two second gate spacers in the Y direction.

18. The device structure as claimed in claim 16, further comprising:

two front side blocks which are connected to and disposed at two opposite sides of the first front protrusion, respectively, one of the two front side blocks connecting the front dielectric wall to a corresponding one of the two first gate spacers; and two rear side blocks which are connected to and disposed at two opposite sides of the first rear protrusion, respectively, one of the two rear side blocks connecting the rear dielectric wall to a corresponding one of the two first gate spacers.

19. A method for manufacturing a device structure, comprising:

forming a fin structure on a substrate, the fin structure being elongated in an X direction;

forming a gate structure on the fin structure, the gate structure being elongated in a Y direction transverse to the X direction to terminate at two opposite ends;

forming a pair of gate spacers which are spaced apart from each other in the X direction and are respectively disposed on two lateral sides of the gate structure, and which are elongated in the Y direction;

performing a patterning operation to remove a front part and a rear part of the gate structure to form a front trench and a rear trench and to leave a main part of the gate structure, the front part and the rear part of the gate structure being opposite to each other in the Y direction;

performing a recessing process to recess the main part of the gate structure through the front trench and the rear trench to form a front recess and a rear recess, each of the front recess and the rear recess being disposed between the pair of gate spacers; and forming a front dielectric portion in the front trench and the front recess, and forming a rear dielectric portion in the rear trench and the rear recess.

20. The method as claimed in claim 19, wherein:

in the patterning operation, a front part and a rear part of the pair of gate spacers are removed to leave a main part of the pair of gate spacers, the front part and the rear part of the pair of gate spacers being opposite to each other in the Y direction; and after the recessing process, each of the front recess and the rear recess is disposed between the main part of the pair of gate spacers.

* * * * *